United States Patent
Sudo

(10) Patent No.: US 11,115,028 B2
(45) Date of Patent: Sep. 7, 2021

(54) OSCILLATOR, ELECTRONIC APPARATUS, AND VEHICLE

(71) Applicant: SEIKO EPSON CORPORATION, Tokyo (JP)

(72) Inventor: Yasuhiro Sudo, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/809,159

(22) Filed: Mar. 4, 2020

(65) Prior Publication Data

US 2020/0287553 A1 Sep. 10, 2020

(30) Foreign Application Priority Data

Mar. 5, 2019 (JP) .............................. JP2019-039136

(51) Int. Cl.
*H03L 1/02* (2006.01)
*H03L 1/04* (2006.01)
(Continued)

(52) U.S. Cl.
CPC ............... *H03L 1/026* (2013.01); *H03B 5/04* (2013.01); *H03H 9/02448* (2013.01);
(Continued)

(58) Field of Classification Search
CPC . H03L 1/026; H03L 1/04; H03L 1/027; H03L 7/0991; H03L 7/18; H03H 9/02448; H03K 3/03; H03K 3/011
See application file for complete search history.

(56) References Cited

U.S. PATENT DOCUMENTS 5,214,668 A 5/1993 Satou et al.
7,545,228 B1 6/2009 Lu et al.
(Continued)

FOREIGN PATENT DOCUMENTS

JP H04-363913 A 12/1992
JP 2012-170050 A 9/2012
JP 2014-116791 A 6/2014

OTHER PUBLICATIONS

Esterline, John C., "Temperature Compensation of Crystal Oscillators Using an Artificial Neural Network," Greenray Industries, 2012, 7 pages.

*Primary Examiner* — Jeffrey M Shin
(74) *Attorney, Agent, or Firm* — Rankin, Hill & Clark LLP

(57) ABSTRACT

Provided is an oscillator including: a first resonator; a second resonator; a first oscillation circuit generating a first oscillation signal by oscillating the first resonator; a second oscillation circuit generating a second oscillation signal that has frequency-temperature characteristics different from frequency-temperature characteristics of the first oscillation signal by oscillating the second resonator; a clock signal generation circuit generating a clock signal with a frequency that is temperature compensated by temperature compensation data; a storage unit storing information on a learned model that is machine-learned to output data corresponding to the temperature compensation data with respect to input data; and a processing circuit obtaining the temperature compensation data by performing processing based on the information on the learned model with respect to the input data based on the first oscillation signal and the second oscillation signal.

14 Claims, 15 Drawing Sheets

(51) Int. Cl.
    *H03L 7/099*     (2006.01)
    *H03H 9/02*     (2006.01)
    *H03B 5/04*     (2006.01)
    *H03K 3/03*     (2006.01)
    *H03L 7/18*     (2006.01)

(52) U.S. Cl.
    CPC ............. *H03K 3/03* (2013.01); *H03L 1/04* (2013.01); *H03L 7/0991* (2013.01); *H03L 7/18* (2013.01)

(56) References Cited

U.S. PATENT DOCUMENTS

| | | |
|---|---|---|
| 10,247,621 B1 | 4/2019 | Partridge et al. |
| 2007/0247246 A1 | 10/2007 | Hagelin |
| 2007/0290764 A1 | 12/2007 | Partridge et al. |
| 2012/0194277 A1* | 8/2012 | Akaike .............. H03L 1/026 331/2 |
| 2013/0041859 A1 | 2/2013 | Esterlilne |
| 2014/0159821 A1 | 6/2014 | Yorita |
| 2014/0337261 A1 | 11/2014 | Esterline |
| 2015/0028960 A1* | 1/2015 | Yorita .............. H03L 1/026 331/176 |
| 2015/0142715 A1 | 5/2015 | Esterline et al. |

* cited by examiner

TEMPERATURE

TEMPERATURE

OSCILLATOR, ELECTRONIC APPARATUS, AND VEHICLE

The present application is based on, and claims priority from JP Application Serial Number 2019-039136, filed Mar. 5, 2019, the disclosure of which is hereby incorporated by reference herein in its entirety.

BACKGROUND

1. Technical Field

The present disclosure relates to an oscillator, an electronic apparatus, a vehicle and the like.

2. Related Art

In the related art, a temperature compensated oscillator that performs temperature compensation based on a temperature detection result is known. As such a temperature compensated oscillator, for example, the related art disclosed in JP-A-4-363913 is known. JP-A-4-363913 discloses a temperature compensated oscillator that performs temperature compensation by detecting a temperature change from a frequency difference between oscillations of two resonators.

The oscillator in JP-A-4-363913 performs temperature compensation processing for controlling the oscillation frequency to be constant based on a digital value written in a ROM in advance. Therefore, the storage capacity of the ROM has become a bottleneck, and there has been a problem that highly accurate temperature compensation processing is difficult.

SUMMARY

An aspect of the present disclosure relates to an oscillator including: a first resonator; a second resonator; a first oscillation circuit generating a first oscillation signal by oscillating the first resonator; a second oscillation circuit generating a second oscillation signal that has frequency-temperature characteristics different from frequency-temperature characteristics of the first oscillation signal by oscillating the second resonator; a clock signal generation circuit generating a clock signal with a frequency that is temperature compensated by temperature compensation data; a storage unit storing information on a learned model that is machine-learned to output data corresponding to the temperature compensation data with respect to input data; and a processing circuit obtaining the temperature compensation data by performing processing based on the information on the learned model with respect to the input data based on the first oscillation signal and the second oscillation signal.

DESCRIPTION OF EXEMPLARY EMBODIMENTS

Hereinafter, the present embodiment will be described. Note that the present embodiment to be described below does not unduly limit the contents of the disclosure described in the appended claims. In addition, all configurations to be described in the present embodiment are not limited to being essential constituent conditions.

1. Oscillator

Figure 1:
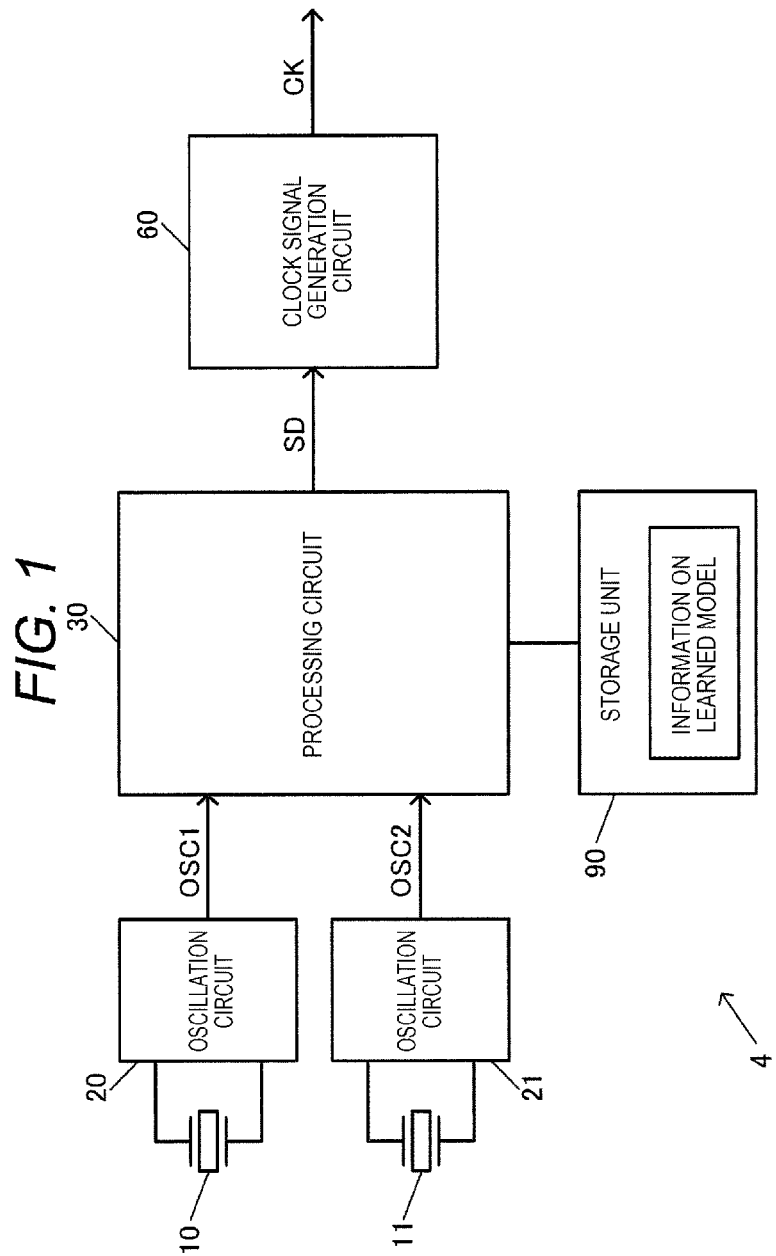
FIG. 1 shows a configuration example of an oscillator according to the present embodiment.

FIG. 1 shows a configuration example of an oscillator 4 according to the present embodiment. The oscillator 4 is a temperature compensated oscillator and includes resonators 10 and 11, oscillation circuits 20 and 21, a processing circuit 30, and a clock signal generation circuit 60. The processing circuit 30 includes a measurement circuit 32. The oscillator 4 may be a temperature compensated crystal oscillator (TCXO) that does not include a constant temperature oven, or may be a constant temperature oven controlled crystal oscillator (OCXO) that includes a constant temperature oven. The resonator 10 is a first resonator, and the resonator 11 is a second resonator. The oscillation circuit 20 is a first oscillation circuit, and the oscillation circuit 21 is a second oscillation circuit. In the present embodiment, the oscillation circuits 20 and 21, the processing circuit 30, and the clock signal generation circuit 60 can be provided in a circuit device. The circuit device is a semiconductor chip in which circuit elements are formed on a semiconductor substrate. Alternatively, the oscillation circuits 20 and 21 may be provided in a first circuit device that is a first semiconductor chip, and the processing circuit 30 and the clock signal generation circuit 60 may be provided in a second circuit device that is a second semiconductor chip. The resonator 10 is electrically coupled to the oscillation circuit 20, and the resonator 11 is electrically coupled to the oscillation circuit 21. For example, the resonators 10, 11 and the oscillation circuits 20, 21 are electrically coupled to each other via a bonding wire, a metal bump, an internal wiring of a package, or the like.

The resonators 10 and 11 are an element generating mechanical vibration by an electric signal. The resonators 10 and 11 can be realized by a resonator element such as a quartz crystal resonator element, for example. For example, the resonators 10 and 11 can be realized by a quartz crystal resonator element in which a cut angle vibrates in a thickness-slide manner such as an AT cut or a SC cut. Note that the resonators 10 and 11 according to the present embodiment can be realized by various resonator elements such as resonator elements other than a thickness-slide vibration type or piezoelectric resonator elements formed of materials other than quartz crystal. For example, as the resonators 10 and 11, a surface acoustic wave (SAW) resonator, a micro electro mechanical systems (MEMS) resonator as a silicon resonator formed using a silicon substrate, or the like may be adopted.

For example, the oscillator 4 includes a package in which the resonators 10 and 11, and the circuit device are accommodated. In this case, the circuit device that is a semiconductor chip includes the oscillation circuits 20 and 21, the processing circuit 30, the clock signal generation circuit 60, and the storage unit 90. The package is made of, for example, ceramic or the like, and has an accommodation space inside thereof. For example, the package includes a base and a lid, and the lid is bonded to the upper surface of the base so as to form an accommodation space between the base and the lid. In this way, the resonators 10 and 11, and the circuit device are accommodated in the accommodation space hermetically sealed by the base and the lid. In this case, the resonators 10 and 11 are, for example, arranged adjacent to each other inside the package of the oscillator 4. For example, the resonators 10 and 11 are arranged adjacent to each other on one substrate. For example, the resonators 10 and 11 are arranged so as to be temperature coupled. Thereby, the temperature environment around the resonators 10 and 11 can be made the same temperature environment. Alternatively, the oscillator 4 may include a first package in which the resonators 10 and 11, and the first circuit device are accommodated, and a second package in which the first package and the second circuit device are accommodated. In this case, the first circuit device that is the first semiconductor chip includes the oscillation circuits 20 and 21, and the second circuit device that is the second semiconductor chip includes the processing circuit 30, the clock signal generation circuit 60, and the storage unit 90. The resonators 10 and 11 are arranged so as to be adjacent to each other inside the first package of the oscillator 4, for example, so as to be temperature coupled.

The oscillation circuit 20 generates the oscillation signal OSC1 by causing the resonator 10 to oscillate. The oscillation circuit 21 generates the oscillation signal OSC2 by causing the resonator 11 to oscillate. The oscillation signal OSC1 is a first oscillation signal, and the oscillation signal OSC2 is a second oscillation signal. The oscillation signals OSC1 and OSC2 can also be called oscillation clock signals. For example, the oscillation signal OSC2 is an oscillation signal having frequency-temperature characteristics different from that of the oscillation signal OSC1. For example, in the present embodiment, the resonators 10 and 11 have different frequency-temperature characteristics of oscillation. As described above, the frequency-temperature characteristics of the resonators 10 and 11 are different, so that the frequency-temperature characteristics of the oscillation signals OSC1 and OSC2 are also different. For example, the frequency-temperature characteristics of the resonators 10 and 11 can be made different by making a cut angle for an AT cut of the resonator different from a cut angle of the resonator 11. Alternatively, either one of the AT cut and the Y cut may be used as the resonator 10, and the resonator of the other cut may be used as the resonator 11. Note that the method of making the frequency-temperature characteristics of the oscillation signals OSC1 and OSC2 different is not limited to the method described above, and various methods can be used.

Each of the oscillation circuits 20 and 21 includes an oscillation drive circuit provided between the first resonator terminal and the second resonator terminal. For example, each of the oscillation circuits 20 and 21 can be realized by a transistor such as a bipolar transistor that realizes a drive circuit and an active element such as a capacitor or a resistor. As the oscillation circuits 20 and 21, various types of oscillation circuits can be used such as a Pierce type, a Colpitts type, an inverter type, or a Hartley type. Further, a variable capacitance circuit may be provided in each of the oscillation circuits 20 and 21. When such a variable capacitance circuit is provided, the oscillation frequency can be adjusted by adjusting a capacitance value of the variable capacitance circuit. The variable capacitance circuit can be realized by a variable capacitance element such as a varactor. The variable capacitance circuit can be electrically coupled to one end of each resonator of the resonators 10 and 11.

Note that a first variable capacitance circuit coupled to one end of each resonator and a second variable capacitance circuit electrically coupled to the other end of each resonator may be provided. The oscillation signals OSC1 and OSC2 output from the oscillation circuits 20 and 21 are not limited to oscillation signals obtained directly by the oscillation of the resonators 10 and 11, and may be signals obtained by dividing the oscillation signals. Further, the coupling in the present embodiment is an electrical coupling. The electrical coupling is a coupling to which an electrical signal is transmittable, and a coupling that enables transmission of information by an electrical signal. The electrical coupling may be a coupling via an active element or the like.

Figure 15:
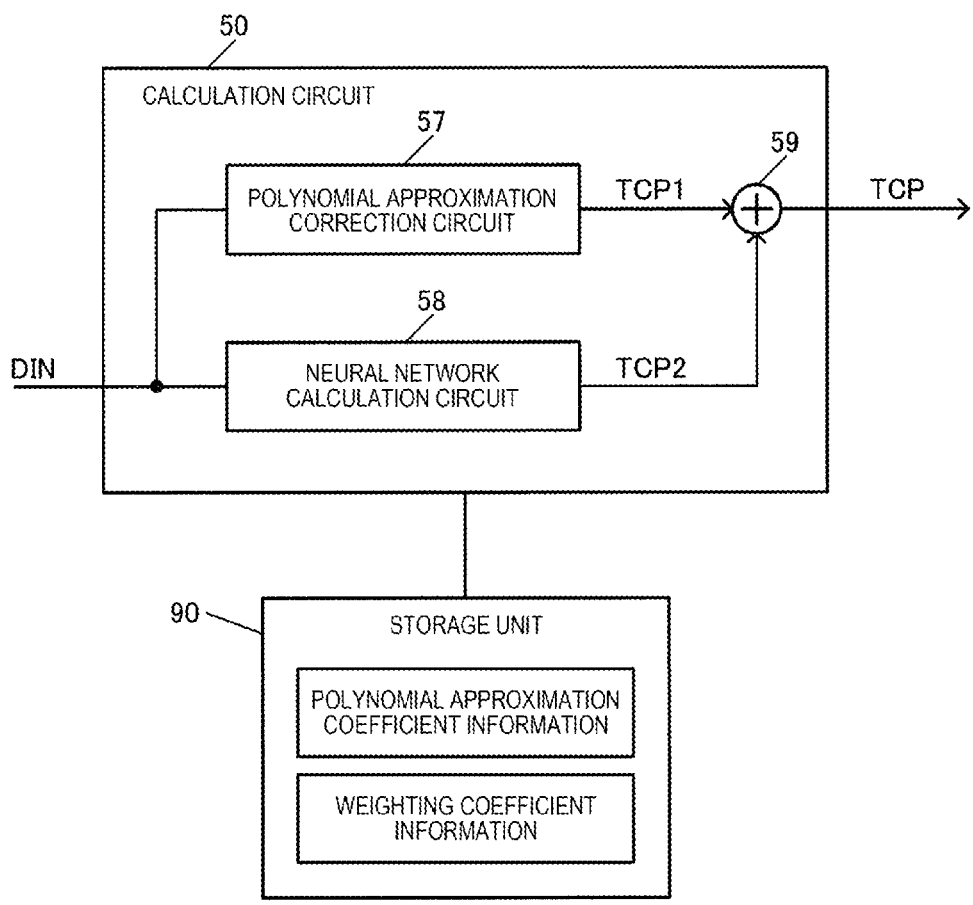
FIG. 15 shows a configuration example of a calculation circuit when learning a correction residual of polynomial approximation correction.

The storage unit 90 stores information on a learned model. For example, the storage unit 90 stores the information on the learned model that is machine-learned so as to output data corresponding to the temperature compensation data with respect to input data. For example, when the processing circuit 30 performs the neural network calculation, the storage unit 90 stores information about the weighting coefficient of the neural network calculation as the information on the learned model. The data corresponding to the temperature compensation data may be the temperature compensation data itself or data for obtaining the temperature compensation data. For example, as shown in FIG. 15 to be described later, when learning the correction residual of the polynomial approximation correction, the data corresponding to the temperature compensation data is the temperature compensation data TCP2 for the correction residual, and the temperature compensation data TCP is obtained based on the temperature compensation data TCP2. The storage unit 90 can be realized by a semiconductor memory such as a non-volatile memory, for example. As the non-volatile memory, an electrically erasable programmable read-only memory (EEPROM) capable of electrical erasure of data, or an one time programmable (OTP) memory or the like using a floating gate avalanche injection MOS (FAMOS) or the like can be used.

The processing circuit 30 is a circuit that performs various processing in the oscillator 4. For example, the processing circuit 30 obtains the temperature compensation data by performing processing based on the information on the learned model stored in the storage unit 90. Specifically, the processing circuit 30 obtains temperature compensation data by performing processing based on the information on the learned model with respect to the input data based on the oscillation signal OSC1 and the oscillation signal OSC2. The temperature compensation is processing for suppressing and compensating the frequency fluctuation of the clock signal CK due to a temperature fluctuation. The processing circuit 30 can be realized, for example, by an application specific integrated circuit (ASIC) using automatic placement and wiring such as a gate array. Alternatively, the processing circuit 30 may be realized by a processor such as a digital signal processor (DSP) or a central processing unit (CPU).

The clock signal generation circuit 60 generates a clock signal CK with a frequency that is temperature compensated by the temperature compensation data. For example, the processing circuit 30 outputs setting data SD for setting the frequency and the like of the clock signal CK to the clock signal generation circuit 60. Specifically, the processing circuit 30 outputs setting data SD corrected by the temperature compensation data, and the clock signal generation circuit 60 generates a clock signal CK based on the setting data SD. For example, the clock signal generation circuit 60 generates the clock signal CK based on one of the oscillation signals OSC1 and OSC2, and the setting data SD. Since the setting data SD is data corrected by the temperature compensation data, the clock signal generation circuit 60 generates the clock signal CK based on the setting data SD, so that a clock signal CK with the frequency that is temperature compensated by the temperature compensation data can be generated.

Figure 2:
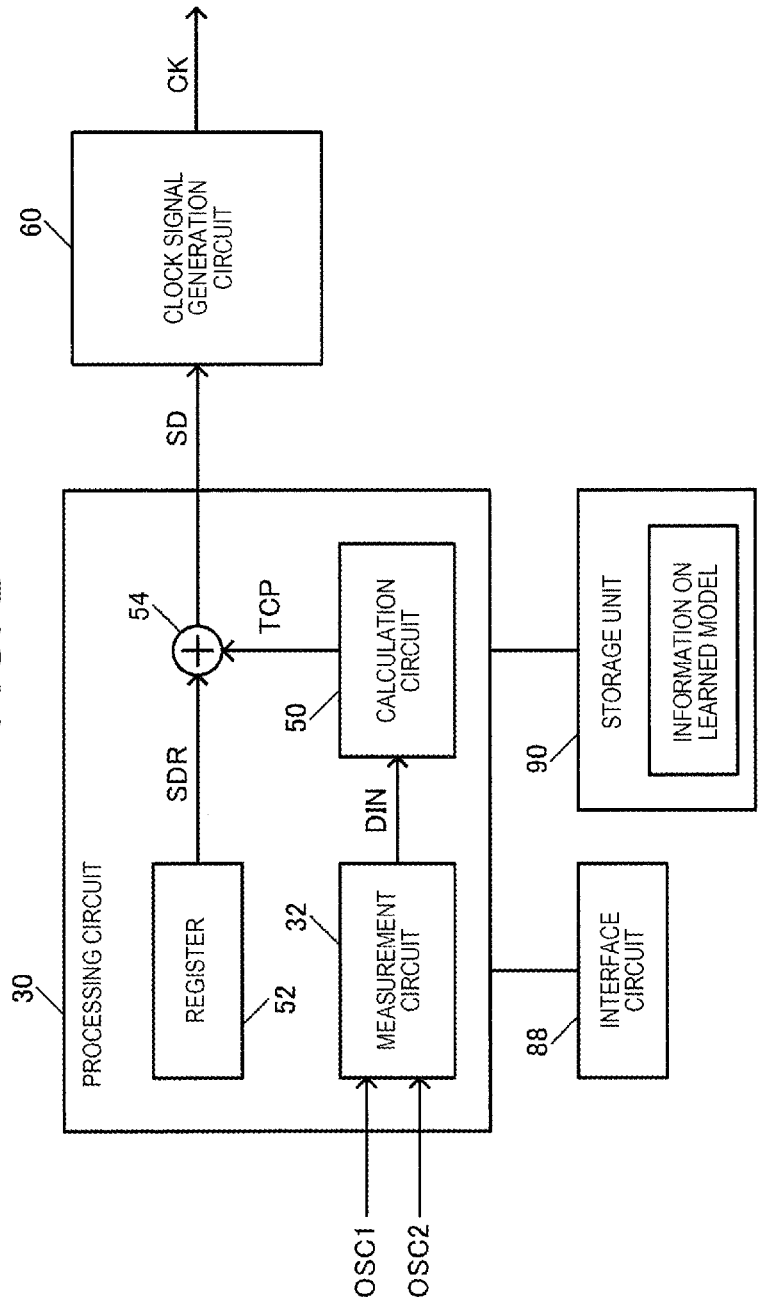
FIG. 2 shows a configuration example of a processing circuit.

FIG. 2 shows a configuration example of the processing circuit 30. The processing circuit 30 includes a measurement circuit 32 and a calculation circuit 50. In addition, the processing circuit 30 can include a register 52 and an adder 54. The measurement circuit 32 receives the oscillation signals OSC1 and OSC2. The measurement circuit 32 performs measurement processing based on the oscillation signals OSC1 and OSC2, and outputs the measurement data. The calculation circuit 50 receives the measurement data from the measurement circuit 32 as input data DIN, and obtains temperature compensation data TCP based on the information on the learned model in the storage unit 90. The temperature compensation data TCP is data for compensating so that the frequency of the clock signal CK becomes constant with respect to a temperature change. The processing circuit 30 outputs the setting data SD corrected by the temperature compensation data TCP to the clock signal generation circuit 60. The setting data SD is data for setting the frequency of the clock signal CK, for example. For example, the register 52 stores reference setting data SDR. The register 52 can be realized by a flip-flop circuit, for example. Alternatively, the register 52 may be realized by a memory such as a RAM. The processing circuit 30 performs processing of adding the temperature compensation data TCP to the reference setting data SDR using the adder 54, and outputs the setting data SD obtained by the adding processing to the clock signal generation circuit 60. The clock signal generation circuit 60 generates a clock signal CK based on the setting data SD. For example, a clock signal CK with a frequency set by the setting data SD is generated.

The measurement circuit 32 performs measurement processing for temperature detection by performing count processing or the like based on the oscillation signals OSC1 and OSC2, for example. For example, the measurement circuit 32 detects the temperature of the environment by measuring the frequency difference between the oscillation signals OSC1 and OSC2 based on the oscillation signals OSC1 and OSC2. For example, the measurement circuit 32 measures the frequency difference by obtaining the count value of the oscillation signal OSC2 during the period when the count value by the oscillation signal OSC1 becomes a predetermined value. Further, data representing the frequency difference is input to the calculation circuit 50 as input data DIN. The storage unit 90 stores the information on the learned model that is machine-learned so as to output data corresponding to the temperature compensation data TCP with respect to input data DIN. The calculation circuit 50 obtains the temperature compensation data TCP by performing processing based on the information on the learned model with respect to the input data DIN based on the oscillation signals OSC1 and OSC2. For example, the calculation circuit 50 performs neural network calculation processing as processing based on the information on the learned model. For example, the calculation circuit 50 uses the weighting coefficient information stored as the information on the learned model and performs neural network calculation processing to obtain the temperature compensation data TCP. The setting data SD corrected by the temperature compensation processing is output to the clock signal generation circuit 60 by adding the temperature compensation data TCP with respect to the reference setting data SDR as a reference for setting the frequency. The clock signal generation circuit 60 generates the clock signal CK based on the setting data SD, so that the clock signal CK with a frequency that is temperature compensated by the temperature compensation data TCP is generated.

In FIG. 2, the oscillator 4 includes an interface circuit 88 that outputs the input data DIN to the outside. For example, the interface circuit 88 is provided in the circuit device included in the oscillator 4 or the second circuit device. The interface circuit 88 is a circuit that realizes an interface such as an inter integrated circuit (I2C) and a serial peripheral interface (SPI), for example. That is, the interface circuit 88 performs interface processing with the external device of the oscillator 4. As will be described later with reference to FIG. 19, the learned model, in which information is stored in the storage unit 90, is a learning model that is machine-learned based on the input data DIN output from the interface circuit 88 and the measurement result of the frequency of the clock signal CK. Since the input data DIN can be output to the outside via the interface circuit 88 as described above, learning processing using the input data DIN can be realized. For example, it becomes possible to make machine learning to output data corresponding to the temperature compensation data TCP with respect to the input data DIN using the data obtained from the measurement result of the frequency of the clock signal CK as teacher data, and information on a learned model that is machine-learned in this way can be stored in the storage unit 90.

Figure 3:
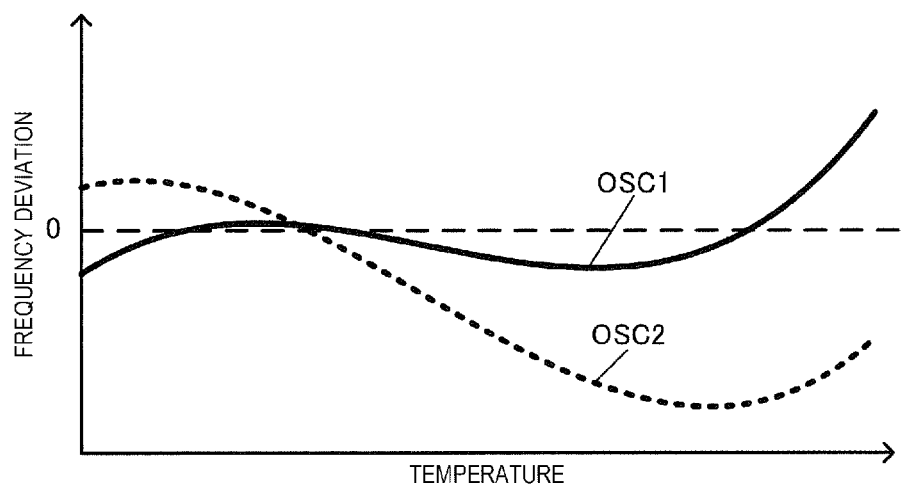
FIG. 3 shows an example of frequency-temperature characteristics of an oscillation signal.
Figure 4:
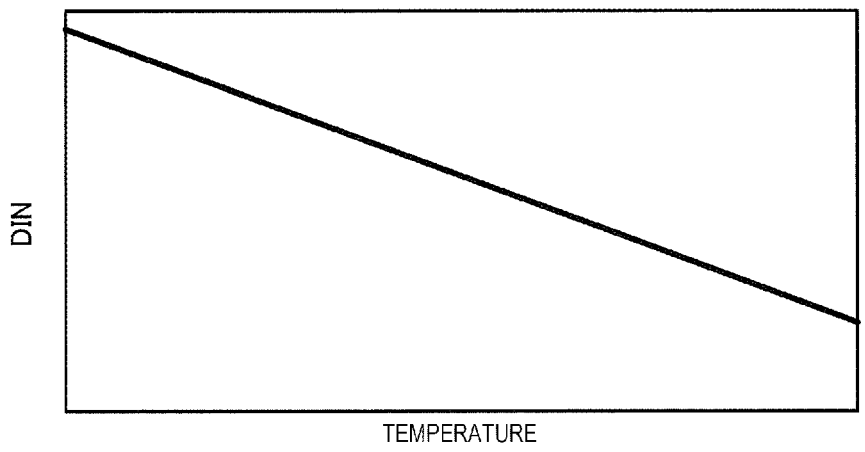
FIG. 4 shows an example of frequency-temperature characteristics of input data corresponding to a frequency difference between oscillation signals.

FIG. 3 shows an example of frequency-temperature characteristics of the oscillation signals OSC1 and OSC2. The frequencies of the oscillation signals OSC1 and OSC2 fluctuate with a frequency deviation of, for example, ±several tens of ppm in a temperature range of, for example, −40° C. or more to 105° C. or less. The frequency deviation referred to here is a value obtained by dividing a difference between a nominal frequency and an actual frequency by the nominal frequency. The resonator 10 that generates the oscillation signal OSC1 and the resonator 11 that generates the oscillation signal OSC2 have different cut angles in, for example, an AT cut, or the like, and have different frequency-temperature characteristics of oscillation. By using the resonators 10 and 11 having different frequency-temperature characteristics, oscillation signals OSC1 and OSC2 having different frequency-temperature characteristics are generated as shown in FIG. 3. The measurement circuit 32 performs the count processing based on the oscillation signals OSC1 and OSC2, thereby the data corresponding to the frequency difference between the oscillation signals OSC1 and OSC2 can be input to the calculation circuit 50 as input data DIN as shown in FIG. 4. As shown in FIG. 4, the input data DIN has frequency characteristics that change monotonically with respect to a temperature change. For example, when the temperature rises, the value of the input data DIN decreases monotonously. For example, higher-order components such as third-order components of the oscillation signals OSC1 and OSC2 are canceled by taking the frequency difference between the oscillation signals OSC1 and OSC2, and only the first-order components remain. Thereby, as shown in FIG. 4, the value of the input data DIN changes linearly (first-order) with respect to the temperature, and this input data DIN can be used as the temperature measurement data. The learned model of the present embodiment is machine-learned so as to output data corresponding to the temperature compensation data TCP with respect to the input data DIN that is the temperature measurement data. Therefore, the calculation circuit 50 can obtain the temperature compensation data TCP by performing the processing such as a neural network calculation based on the information on the learned model with respect to the input data DIN. Thereby, a clock signal CK with a frequency that is temperature compensated by the temperature compensation data TCP is generated.

As described above, in the present embodiment, the storage unit 90 stores the information on the learned model that is machine-learned so as to output data corresponding to the temperature compensation data TCP with respect to input data DIN. The processing circuit 30 performs processing based on the information on the learned model with respect to the input data DIN based on the oscillation signals OSC1 and OSC2, thereby the temperature compensation data TCP is obtained, and the clock signal generation circuit 60 generates a clock signal CK with a frequency that is temperature compensated by the temperature compensation data TCP. In this way, the temperature is measured using the oscillation signals OSC1 and OSC2 having different frequency-temperature characteristics with each other, and the input data DIN based on the oscillation signals OSC1 and OSC2, temperature compensation data TCP corresponding to each temperature is obtained using the information on the learned model, and then the temperature compensation of the clock signal CK can be realized. Therefore, it is possible to realize a highly accurate temperature compensation processing using the learned model.

For example, in the oscillator in JP-A-4-363913 described above, since the temperature compensation by polynomial approximation is performed based on a digital value written in advance in the ROM, the storage capacity of the ROM becomes a bottleneck, and there is a problem that a highly accurate temperature compensation is difficult. For example, when the temperature checking is made fine in order to realize a highly accurate temperature compensation, the used storage capacity of the ROM becomes excessive, and due to this, the highly accurate temperature compensation becomes difficult. Further, when checking the temperature in this way, an interpolation circuit that interpolates between the checked temperatures by a bicubic interpolation or the like is required, and when the highly accurate temperature compensation is to be realized by this interpolation circuit, the interpolation circuit becomes large-scale. The resonator has a singular point of the oscillation frequency. If accurate temperature compensation is performed at this singular point, it is necessary to make the temperature checking very fine, and this causes problems such as an increase in the storage capacity of the ROM and an increase in the size of the interpolation circuit.

In this regard, in the present embodiment, the temperature compensation of the clock frequency is realized using the learned model that is machine-learned to output data corresponding to the temperature compensation data TCP with respect to the input data DIN based on oscillation signals OSC1 and OSC2. For example, since the information on the learned model such as weighting coefficients in the neural network calculation is obtained by machine learning, the storage capacity of the storage unit 90 that stores the information on the learned model does not have to be so large. For example, in the oscillator in JP-A-4-363913, there is a problem that the storage capacity of the ROM becomes excessive when trying to realize highly accurate temperature compensation, but in the method of this embodiment using learned model, even if the storage capacity of the storage unit 90 is not so large, highly accurate temperature compensation can be realized. Further, since the temperature measurement is performed using the plurality of resonators 10 and 11, highly accurate temperature measurement can be realized. Therefore, the temperature compensation with higher accuracy can be realized as compared with the oscillator of JP-A-4-363913.

In the present embodiment, as shown in FIG. 2, temperature compensation data TCP is obtained by performing the processing based on the information on the learned model using the measurement data of the measurement circuit 32 to which the oscillation signals OSC1 and OSC2 are input as input data DIN, and the clock signal CK is generated by the clock signal generation circuit 60 using the setting data SD corrected by the temperature compensation data TCP. In this way, the temperature measurement is performed by the measurement circuit 32 using the oscillation signals OSC1 and OSC2 having different frequency-temperature characteristics with each other, and the temperature compensation data TCP is obtained using the learned model based on the result of the temperature measurement, thereby it becomes possible to perform temperature compensation of the clock signal CK, and to realize highly accurate temperature compensation.

For example, by performing the temperature compensation processing using the information on the learned model, it is possible to realize a more accurate and appropriate temperature compensation processing. For example, at the time of manufacture or shipment of the oscillator 4, the information on the learned model obtained by measuring the frequency-temperature characteristics of the oscillator 4 is written and stored in the storage unit 90 which is realized by a non-volatile memory or the like. For example, at the time of manufacture or shipment of the oscillator 4, the frequency characteristics of the clock signal at each temperature are measured while changing the environmental temperature using a constant temperature oven or the like. Thereafter, the information on the learned model obtained based on the measurement result is written and stored in the storage unit 90. For example, the clock frequency and the temperature measurement result (DIN) at each temperature are monitored, and the information on the learned model that is machine-learned so as to obtain appropriate temperature compensation data TCP at each temperature is written and stored in the storage unit 90. As described above, during the actual operation of the oscillator 4, the processing circuit 30 can execute the temperature compensation processing for obtaining the temperature compensation data TCP corresponding to the input data DIN from the measurement circuit 32. As a result, it is possible to realize the temperature compensation processing in which an affection such as manufacturing process variation or circuit characteristics variation is suppressed and canceled.

For example, in the present embodiment, the processing circuit 30 performs neural network calculation processing as processing based on the information on the learned model. Specifically, the calculation circuit 50 performs neural network calculation processing. A neural network is a mathematical model for simulating brain functions on a computer, and has an input layer, an intermediate layer, and an output layer. The input layer is a neuron that outputs an input value. In each neuron after the intermediate layer, a calculation is performed that simulates how information is transmitted as an electrical signal in a brain. In the brain, since the ease of transmission of information changes according to the synaptic bonding strength, the neural network expresses the bonding strength with a weight. Further, in the calculation in a neuron, an activation function that is a non-linear function is used. For example, a ReLU function, a sigmoid function, or the like is used as the activation function. In each neuron, a calculation is performed for multiplying and summing the outputs of each neuron in the previous layer coupled to the neuron using the weight, a bias is added, and a calculation that applies the activation function is performed. The calculation result in the output layer becomes the output of the neural network.

In a neural network, in order to obtain a desired output from an input, it is necessary to set appropriate weights and biases. Note that the weight is also represented as a weighting coefficient. The weighting coefficient may include a bias. In learning, a data set in which an input is associated with a correct output at the input is prepared. The correct output is teacher data. Neural network learning processing can be considered as processing for obtaining the most probable weighting coefficient based on the data set. As the neural network learning processing, for example, an error inverse propagation method can be used. In the error inverse propagation method, parameters are updated by repeating the forward path and the backward path. The parameter here is a weighting coefficient.

In this embodiment, the input of the neural network is input data DIN that is input from the measurement circuit 32 to the calculation circuit 50, and the input data DIN can be used as the temperature measurement data as shown in FIG. 4. The storage unit 90 stores, for example, the weighting coefficient information of the neural network as the information on the learned model. Alternatively, the storage unit 90 may store the information relating to the configuration of a neural network, and the information relating to the sequence control of a neural network calculation, as the information on the learned model. An input layer, an intermediate layer, and an output layer are included in the learned model, and the weighting coefficient information is set based on a data set in which the input data DIN and the temperature compensation data TCP are associated with each other. The calculation circuit 50 performs a calculation based on the weighting coefficient information stored in the storage unit 90 using the input data DIN as an input of the input layer of the learned model, and performs a neural network calculation so that the temperature compensation data TCP is output as the output of the output layer of the learned model. In this case, for example, in the learning stage at the time of manufacture and shipment, the clock frequency at each temperature is measured, and a temperature compensation data TCP for making the clock frequency constant with respect to the temperature change is obtained based on the measured clock frequency. Based on the data set in which the temperature compensation data TCP and the input data DIN corresponding to the temperature measurement data at each temperature are associated with each other, the weighting coefficient information is set, and written in the storage unit 90 as the information on the learned model. As described above, it becomes possible to realize temperature compensation processing with the clock frequency by processing based on the learned model.

Note that the machine learning in the present embodiment is not limited to a technique using a neural network. Various well-known machine learning methods such as a support vector machine (SVM), or machine learning methods developed from these methods can be applied, for example. The information on the learned model may be updated after the oscillator 4 is shipped. The temperature compensation processing based on the information on the learned model only needs to operate in a state where the oscillator 4 is mounted. The configuration for performing the temperature compensation processing is not necessarily limited to that accommodated in the same package as other circuit elements, and may be provided outside the package of the oscillator 4.

2. Clock Signal Generation Circuit

Figure 5:
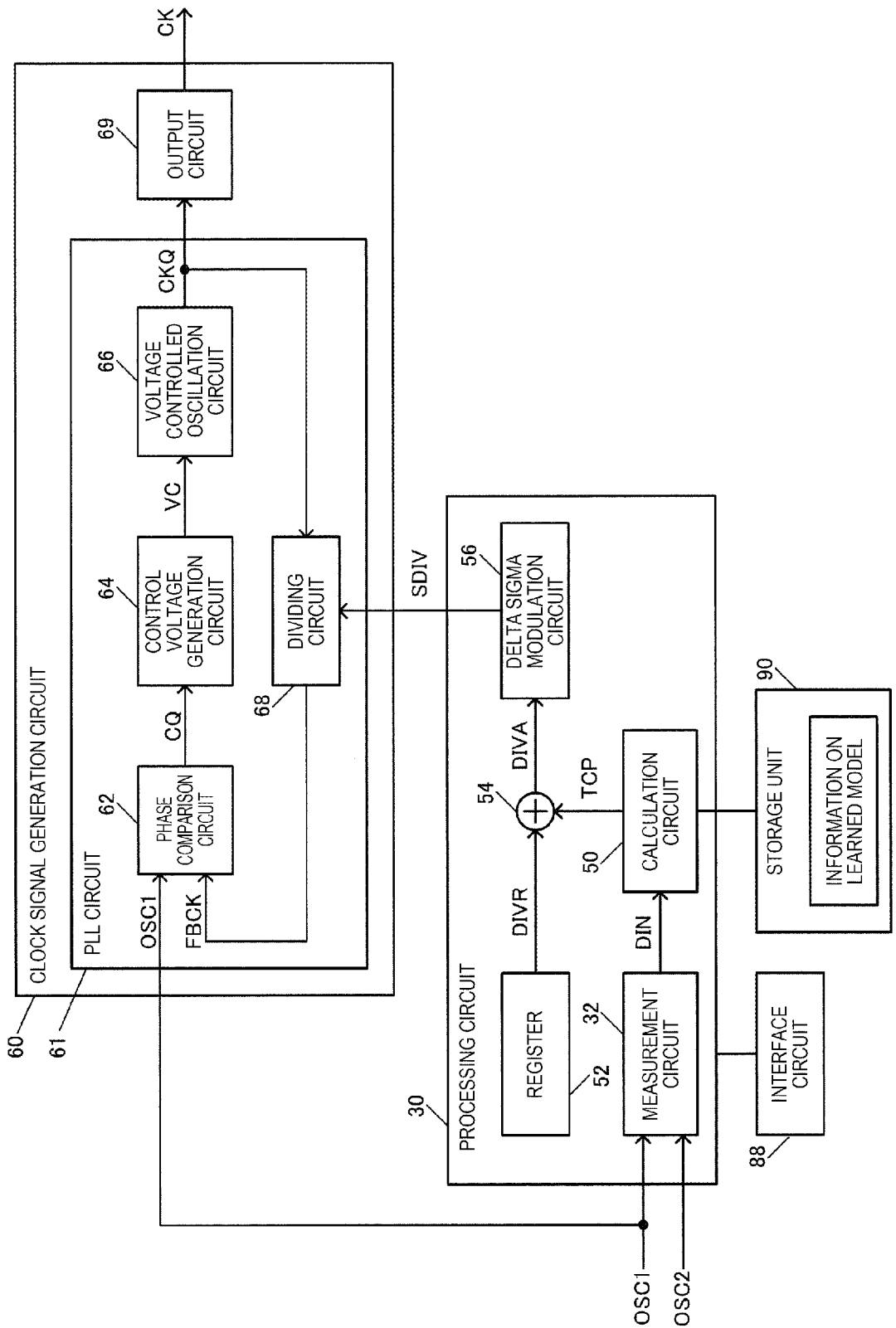
FIG. 5 shows a first configuration example of a clock signal generation circuit.

Next, a configuration example of the clock signal generation circuit 60 will be described. FIG. 5 shows a first configuration example of the clock signal generation circuit 60. In FIG. 5, the clock signal generation circuit 60 includes a fractional N-type PLL circuit 61. For example, the PLL circuit 61 receives the oscillation signal OSC1 as an input clock signal. The input clock signal is a reference clock signal of the PLL circuit 61. Note that the oscillation signal OSC2 may be input to the PLL circuit 61 as an input clock signal. The processing circuit 30 outputs the division ratio setting data SDIV corrected by the temperature compensation data TCP with respect to the dividing circuit 68 included in the PLL circuit 61. In this case, the setting data SD in FIG. 2 becomes the division ratio setting data SDIV.

As described above, in FIG. 5, the clock signal generation circuit 60 includes the fractional N-type PLL circuit 61 to which the oscillation signal OSC1 is input as the input clock signal, and the division ratio setting data SDIV is input to the dividing circuit 68 of the PLL circuit 61. In this way, the division ratio setting data SDIV corrected by the temperature compensation data TCP is input to the dividing circuit 68 of the PLL circuit 61, and a PLL operation for multiplying the frequency of the oscillation signal OSC1 is realized, and the clock signal CK based on the signal obtained by multiplying the frequency of the oscillation signal OSC1 can be generated. Thereby, the clock signal CK, on which the temperature compensation processing is performed, can be generated based on the oscillation signal OSC1. Further, by using the fractional N-type PLL circuit 61, not only an integer but also a fraction can be set as a division ratio of the PLL circuit 61, and a clock signal CK having any frequency can be generated.

Next, the configurations of the clock signal generation circuit 60 and the processing circuit 30 in FIG. 5 will be described in more detail. In FIG. 5, the clock signal generation circuit 60 includes a PLL circuit 61 and an output circuit 69.

The output circuit 69 outputs the clock signal CK based on the output clock signal CKQ of the PLL circuit 61. For example, the output circuit 69 includes a dividing circuit (not shown), and can variably set the frequency of the clock signal CK by dividing the frequency of the output clock signal CKQ by the dividing circuit. Thereby, the frequency of the clock signal CK can be set to a frequency desired by a user. Further, the output circuit 69 outputs the clock signal CK to the outside in a signal format such as a low voltage differential signaling (LVDS), a positive emitter coupled logic (PECL), an high speed current steering logic (HCSL), or a differential complementary MOS (CMOS). For example, the output circuit 69 may be a circuit that can output the clock signal CK in at least two signal formats of LVDS, PECL, HCSL, and differential CMOS. In this case, the output circuit 69 outputs the clock signal CK in the signal format set by the processing circuit 30.

The PLL circuit 61 receives the oscillation signal OSC1 as an input clock signal and performs a phase locked loop (PLL) operation. For example, the PLL circuit 61 generates an output clock signal CKQ having a frequency obtained by multiplying the frequency of the oscillation signal OSC1. That is, a highly accurate output clock signal CKQ that is phase synchronized with the oscillation signal OSC1 is generated. The PLL circuit 61 includes a phase comparison circuit 62, a control voltage generation circuit 64, a voltage controlled oscillation circuit 66, and a dividing circuit 68.

The phase comparison circuit 62 performs a phase comparison between the oscillation signal OSC1 that is the input clock signal and a feedback clock signal FBCK. For example, the phase comparison circuit 62 compares the phases of the oscillation signal OSC1 and the feedback clock signal FBCK, and outputs a signal CQ corresponding to a phase difference between the oscillation signal OSC1 and the feedback clock signal FBCK as a signal of a phase comparison result. The signal CQ corresponding to the phase difference is, for example, a pulse signal of a pulse width proportional to the phase difference.

The control voltage generation circuit 64 generates a control voltage VC based on the result of the phase comparison obtained from the phase comparison circuit 62. For example, the control voltage generation circuit 64 generates the control voltage VC for controlling the oscillation of the voltage controlled oscillation circuit 66 by performing a charge pump operation or filter processing based on the signal CQ of the phase comparison result from the phase comparison circuit 62.

A voltage controlled oscillation circuit 66 that is a voltage controlled oscillator (VCO) generates an output clock signal CKQ having a frequency corresponding to the control voltage VC. For example, an oscillation operation is performed based on the control voltage VC from the control voltage generation circuit 64 to generate the output clock signal CKQ. For example, the voltage controlled oscillation circuit 66 generates an output clock signal CKQ having a frequency that changes according to the control voltage VC by the oscillation operation. As an example, the voltage controlled oscillation circuit 66 has a variable capacitance element such as a varactor. By changing the capacitance of the variable capacitance element based on the control voltage VC, the frequency of the output clock signal CKQ that is an oscillation signal generated by the oscillation operation of the voltage controlled oscillation circuit 66 is changed. As the voltage controlled oscillation circuit 66, for example, an LC oscillation circuit using an inductor can be used.

The dividing circuit 68 divides the output clock signal CKQ and outputs a feedback clock signal FBCK. For example, the dividing circuit 68 outputs a signal having a frequency obtained by dividing the frequency of the output clock signal CKQ by the division ratio set by division ratio setting data SDIV as a feedback clock signal FBCK. For example, when the frequency of oscillation of the voltage controlled oscillation circuit 66 is set to fvco and the division ratio of dividing operation of the dividing circuit 68 is set to DIV, the frequency of the feedback clock signal FBCK becomes fvco/DIV. Then, as described above, the phase comparison circuit 62 performs a phase comparison between the oscillation signal OSC1 and the feedback clock signal FBCK from the dividing circuit 68.

By using the PLL circuit 61 having a configuration including the phase comparison circuit 62, the control voltage generation circuit 64, the voltage controlled oscillation circuit 66, and the dividing circuit 68, the output clock signal CKQ which is phase synchronized with the oscillation signal OSC1 is generated, and a highly accurate clock signal CK based on the output clock signal CKQ can be generated and output.

The processing circuit 30 includes a measurement circuit 32, a calculation circuit 50, a register 52, an adder 54, and a delta sigma modulation circuit 56. The calculation circuit 50 outputs the temperature compensation data TCP by performing processing based on the information on the learned model with respect to the input data DIN from the measurement circuit 32. The adder 54 adds the temperature compensation data TCP to the reference division ratio data DIVR set in the register 52, and outputs addition result data DIVA to the delta sigma modulation circuit 56. The delta sigma modulation circuit 56 performs a delta sigma modulation with respect to the addition result data DIVA and outputs the division ratio setting data SDIV for setting the division ratio of the dividing circuit 68. By performing delta sigma modulation by the delta sigma modulation circuit 56, the PLL circuit 61 operates as the fractional N-type PLL circuit.

For example, in FIG. 5, the dividing circuit 68 and the delta sigma modulation circuit 56 constitute a fractional divider. The fractional divider divides the output clock signal CKQ using the reciprocal of the multiplication ratio of the PLL circuit 61 as a division ratio, and outputs the divided clock signal to the phase comparison circuit 62 as a feedback clock signal FBCK. The delta sigma modulation circuit 56 performs delta sigma modulation on the value of the fraction part of the division ratio to generate a modulation value that is an integer. For example, the delta sigma modulation circuit 56 performs third-order or fourth-order delta sigma modulation processing. The value of the integer part of the division ratio and the added value of the modulation value are set in the dividing circuit 68 as the division ratio setting data SDIV. As a result, a fractional N-type PLL circuit 61 is realized.

Specifically, the delta sigma modulation circuit 56 performs the delta sigma modulation that integrates and quantizes the fractional division ratio L/M to generate a delta sigma modulation signal. The delta sigma modulation circuit 56 performs processing of adding/subtracting the delta sigma modulation signal and an integer division ratio N, and an output signal after the addition/subtraction is input to the dividing circuit 68. In the output signal after the addition/subtraction, a plurality of integer division ratios in the range near the integer division ratio N change in time series, and the average value of time thereof matches N+L/M. The N+L/M is set by the division ratio setting data SDIV from the processing circuit 30. For example, as described above, the frequency of the output clock signal CKQ is set to fvco, and the phase comparison frequency that is the frequency of the oscillation signal OSC1 and the feedback clock signal FBCK is set to fpfd. In this case, in a normal state in which the phase of the oscillation signal OSC1 that is the reference clock signal and the phase of the feedback clock signal FBCK are synchronized, the relational expression of "fvco= (N+L/M)×fpfd" is established. By using the fractional N-type PLL circuit 61 having such a configuration, an output clock signal CKQ obtained by multiplying the oscillation signal OSC1 by a division ratio represented by N+L/M can be generated.

According to the configuration in FIG. 5, it is possible to realize a fractional divider and realize the temperature compensation processing in which fluctuations in the frequency of the clock signal CK due to the temperature change can be suppressed. In addition, according to the present embodiment, the fractional division processing for realizing the fractional divider and the temperature compensation processing are collectively executed by the digital calculation processing in the processing circuit 30. Therefore, the fractional division processing and the temperature compensation processing can be realized while suppressing an increase in the circuit scale.

Figure 6:
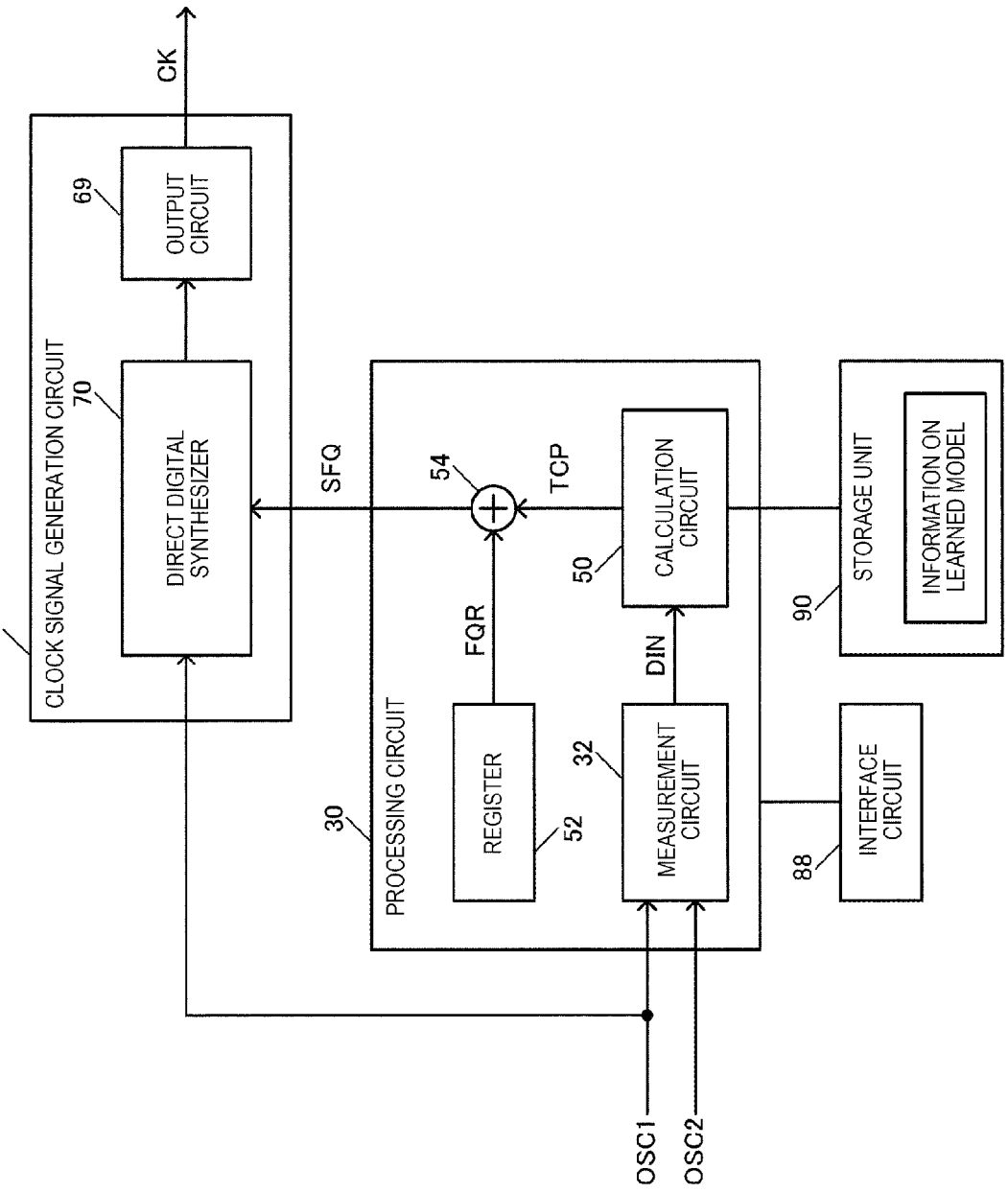
FIG. 6 shows a second configuration example of the clock signal generation circuit.

FIG. 6 shows a second configuration example of the clock signal generation circuit 60. In FIG. 6, the clock signal generation circuit 60 includes a direct digital synthesizer 70. The processing circuit 30 outputs the frequency setting data SFQ corrected by the temperature compensation data TCP to the direct digital synthesizer 70. In this case, the setting data SD in FIG. 2 becomes the frequency setting data SFQ. The direct digital synthesizer 70 generates the clock signal CK with a frequency set by the frequency setting data SFQ using the oscillation signal OSC1 as a reference clock signal. The output circuit 69 outputs the generated clock signal CK to the outside in a signal format such as LVDS, PECL, HCSL, or differential CMOS.

Specifically, the processing circuit 30 includes the measurement circuit 32, a calculation circuit 50, a register 52, and an adder 54. The calculation circuit 50 obtains the temperature compensation data TCP by performing processing based on the information on the learned model with respect to the input data DIN from the measurement circuit 32. Further, the adder 54 adds the temperature compensation data TCP to the reference frequency data FQR set in the register 52, and outputs the frequency setting data SFQ to the direct digital synthesizer 70. The direct digital synthesizer 70 generates a clock signal CK with a frequency set by the frequency setting data SFQ.

The direct digital synthesizer 70 is a circuit that digitally generates a clock signal having any frequency based on a reference clock signal. The reference clock signal is the oscillation signal OSC1. The direct digital synthesizer 70 can include, for example, a phase accumulator that is an integration block and a waveform signal generation circuit. The phase accumulator integrates integration setting values in synchronization with the reference clock signal as an operation for one cycle. The clock frequency is set by the integration setting value. The waveform signal generation circuit can include, for example, a waveform memory and a D/A conversion circuit. The integration result by the phase accumulator becomes an address of the waveform memory, thereby a clock waveform having a clock frequency corresponding to the frequency setting data SFQ is generated.

By using the direct digital synthesizer 70 as shown in FIG. 6, a clock signal CK having any frequency set by the frequency setting data SFQ can be generated. The processing circuit 30 performs the temperature compensation processing for obtaining the temperature compensation data TCP, so that a highly accurate clock signal CK that is temperature compensated can be generated.

Figure 7:
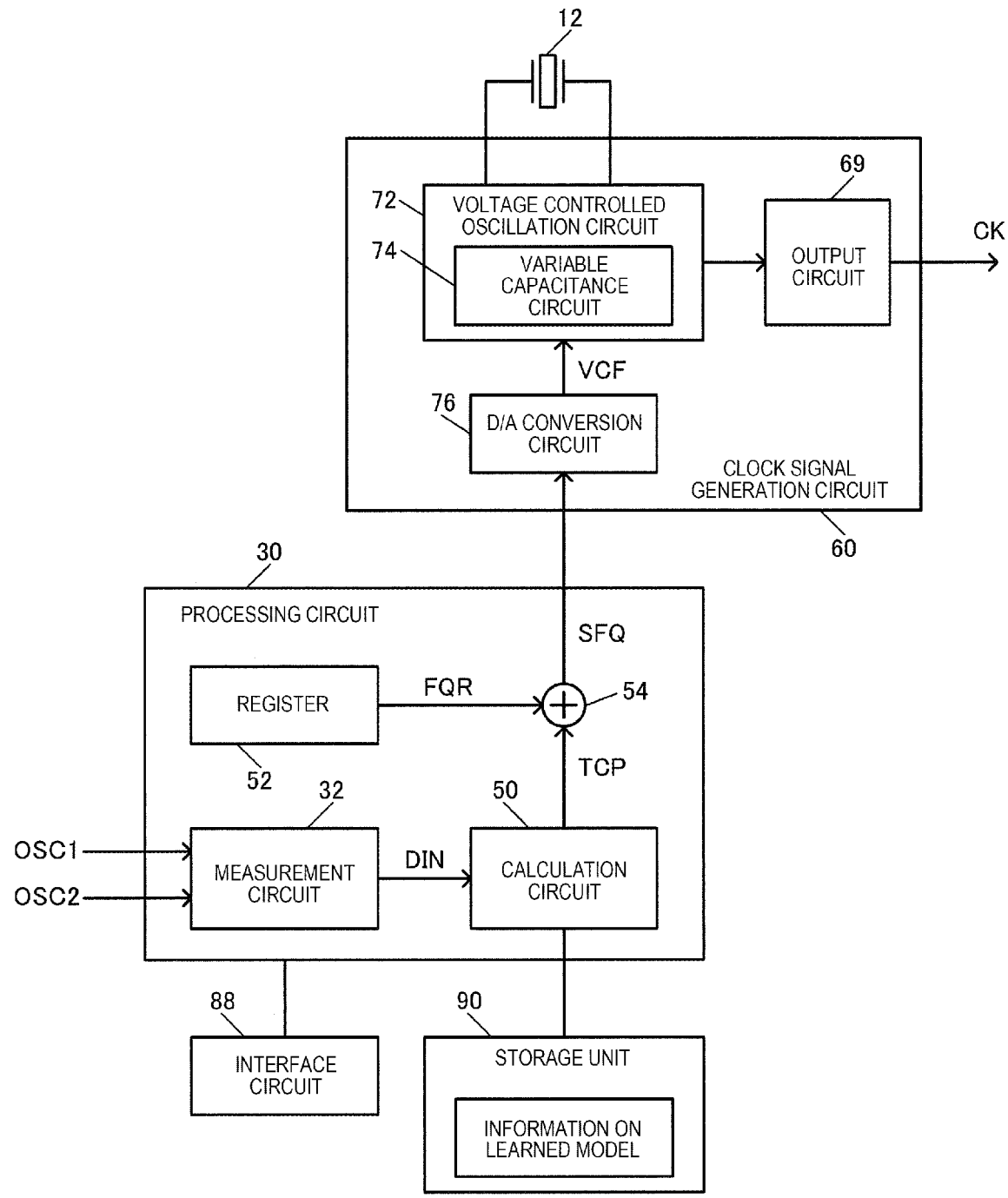
FIG. 7 shows a third configuration example of the clock signal generation circuit.

FIG. 7 shows a third configuration example of the clock signal generation circuit 60. In FIG. 7, the clock signal generation circuit 60 includes a voltage controlled oscillation circuit 72 and a D/A conversion circuit 76. The processing circuit 30 outputs the frequency setting data SFQ corrected by the temperature compensation data TCP. Since the configuration and operation of the processing circuit 30 are the same as those in FIG. 6, the detailed description will be omitted. The D/A conversion circuit 76 D/A converts the frequency setting data SFQ from the processing circuit 30 and outputs a control voltage VCF of frequency. A voltage controlled oscillation circuit 72 that is a VCO oscillates the resonator 12 at a frequency corresponding to the control voltage VCF from the D/A conversion circuit 76. The resonator is a third resonator. As the resonator 12, the same structure and method as those of the resonators 10 and 11 can be used. As an example, the resonator 12 is a quartz crystal resonator. The voltage controlled oscillation circuit 72 includes a variable capacitance circuit 74 that is electrically coupled to one end of the resonator 12, for example. The variable capacitance circuit 74 is realized by a variable capacitance element such as a varactor. The capacitance value of the variable capacitance circuit 74 is controlled based on the control voltage VCF. Thereby, the clock signal CK, on which the temperature compensation is performed by the temperature compensation data TCP, is generated. Note that the variable capacitance circuit coupled to the other end of the resonator 12 may be provided. According to the configuration in FIG. 7, the voltage controlled oscillation circuit 72 performs the oscillation operation based on the control voltage VCF corresponding to the frequency setting data SFQ corrected by the temperature compensation data TCP, so that the temperature compensated clock signal CK can be generated.

In FIG. 7, the resonator 12 different from the resonators 10 and 11 is required. A variable capacitance element of the variable capacitance circuit 74 also has frequency-temperature characteristics, and the frequency accuracy of the clock signal CK decreases due to the frequency-temperature characteristics of the variable capacitance element. In this sense, the configuration of FIGS. 5 and 6 is more advantageous than the configuration of FIG. 7. For example, by using the fractional N-type PLL circuit 61, it is possible to generate a highly accurate clock signal CK with less phase noise.

3. Processing Circuit, Measurement Circuit

Figure 8:
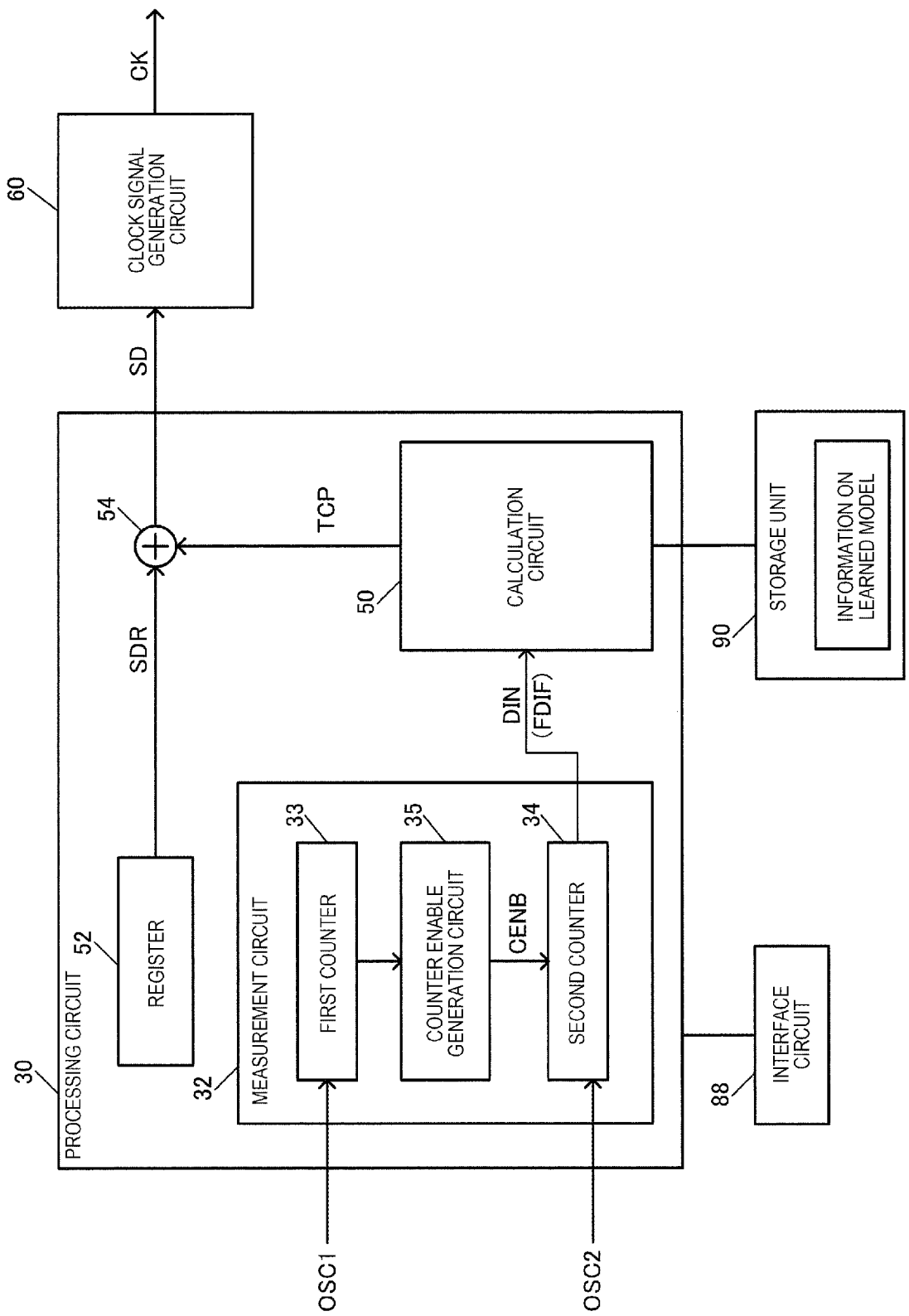
FIG. 8 shows a first configuration example of a processing circuit and a measurement circuit.

Next, detailed configuration examples of the processing circuit 30 and the measurement circuit 32 will be described. FIG. 8 shows a first configuration example of the processing circuit 30 and the measurement circuit 32. In FIG. 8, the processing circuit 30 obtains frequency difference data FDIF indicating the difference between the frequency of the oscillation signal OSC1 and the frequency of the oscillation signal OSC2 based on the oscillation signals OSC1 and OSC2, and performs processing based on the information on the learned model using the frequency difference data FDIF as input data DIN. For example, the measurement circuit 32 obtains the frequency difference data FDIF based on the oscillation signals OSC1 and OSC2. Further, the calculation circuit 50 performs processing based on the information on the learned model by using the frequency difference data FDIF as the input data DIN, and obtains the temperature compensation data TCP. Then, the temperature compensation data TCP is added to the reference setting data SDR, the setting data SD that is the addition result is input to the clock signal generation circuit 60, and the clock signal generation circuit 60 generates a temperature compensated clock signal CK. Thus, by obtaining the frequency difference data FDIF of the oscillation signals OSC1 and OSC2, input data DIN which becomes the temperature measurement data can be obtained, as shown in FIG. 4. The temperature compensation data TCP can be obtained by performing the processing such as a neural network calculation based on the information on the learned model with respect to the input data DIN.

Specifically, in FIG. 8, the measurement circuit 32 includes a first counter 33, a second counter 34, and a counter enable generation circuit 35. The first counter 33 performs a first count processing based on the oscillation signal OSC1. The counter enable generation circuit 35 outputs a counter enable signal CENB to the second counter 34 based on the result of the first count processing. The second counter 34 performs a second count processing based on the oscillation signal OSC2 during a period in which the counter enable signal CENB is active.

Figure 9:
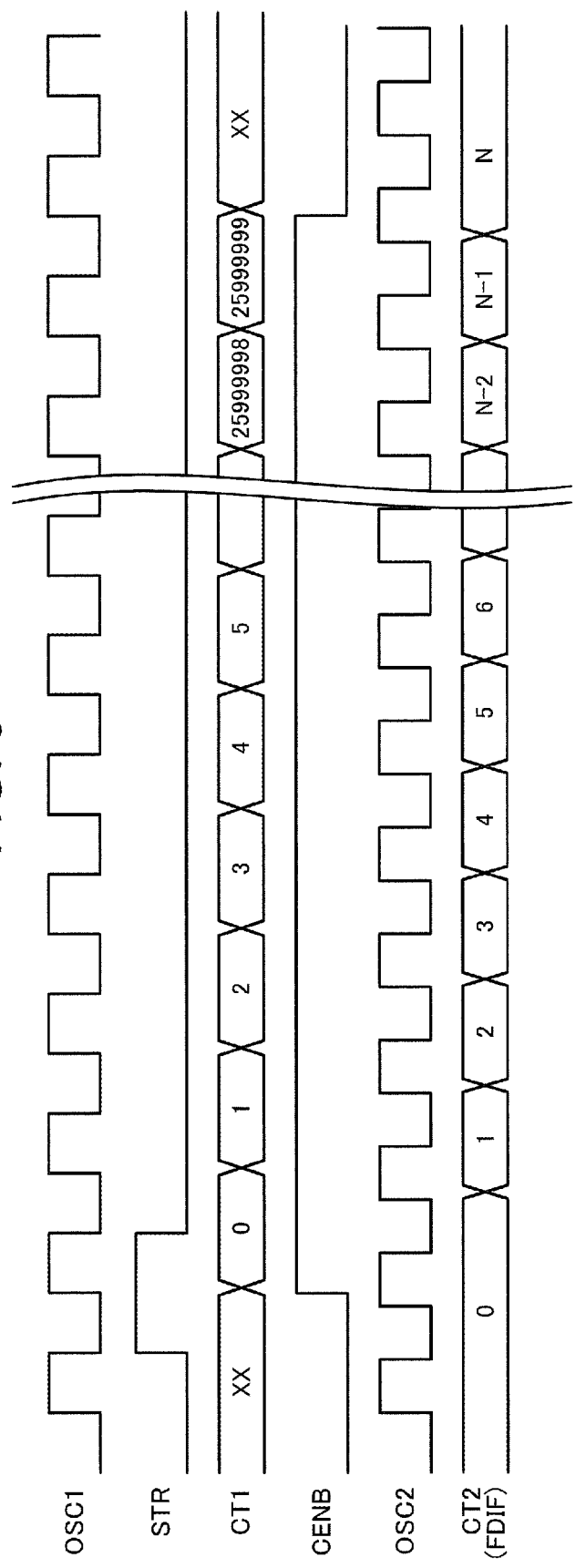
FIG. 9 is a signal waveform example for explaining an operation of the first configuration example.

FIG. 9 is a signal waveform example for explaining an operation of the first configuration example in FIG. 8. As shown in FIG. 9, when a measurement start signal STR from the outside becomes active, the first counter 33 starts the first count processing based on the oscillation signal OSC1. By the first count processing, a count value CT1 of the first counter 33 is incremented. The first counter 33 continues the first count processing until the count value CT1 reaches the measurement end count value. In FIG. 9, the measurement end count value is set to 25999999, for example. The counter enable generation circuit 35 outputs a counter enable signal CENB that becomes active during the period when the first count processing is performed. For example, the counter enable signal CENB becomes active until the count value CT1 starts from 0 and reaches the measurement end count value. The second counter 34 performs the second count processing based on the oscillation signal OSC2 during a period in which the counter enable signal CENB is active. The count value CT2=N of the second counter 34 at the end of the second count processing is output as frequency difference data FDIF.

As described above, in FIGS. 8 and 9, the processing circuit 30 performs the first count processing based on the oscillation signal OSC1, and performs the second count processing based on the oscillation signal OSC2 in a period set by the first count processing. That is, the period during which the counter enable signal CENB is active is set by the first count processing of the first counter 33, and during this period, the second counter 34 performs a second count processing based on the oscillation signal OSC2. Further, the processing circuit 30 performs processing based on the information on the learned model using the count value CT2 of the second count processing as the input data DIN. For example, the count value CT2=N at the end of the second count processing is input to the calculation circuit 50 as the input data DIN, and the calculation circuit 50 performs the processing based on the information on the learned model to obtain the temperature compensation data TCP. In this way, it is possible to perform processing based on the information on the learned model using the frequency difference data FDIF of the oscillation signals OSC1 and OSC2 as the input data DIN. For example, temperature characteristics of the frequency difference data FDIF become first-order temperature characteristics as shown in FIG. 4. For example, by taking the frequency difference between the oscillation signals OSC1 and OSC2, harmonic components such as the third-order components of the oscillation signals OSC1 and OSC2 shown in FIG. 3 are canceled, and by leaving the first-order components, linear first-order temperature characteristics as shown in FIG. 4 can be obtained. In this way, the frequency difference data FDIF can be input to the calculation circuit 50 as the input data DIN, and the temperature compensation data TCP can be obtained using the information on the learned model.

Figure 10:
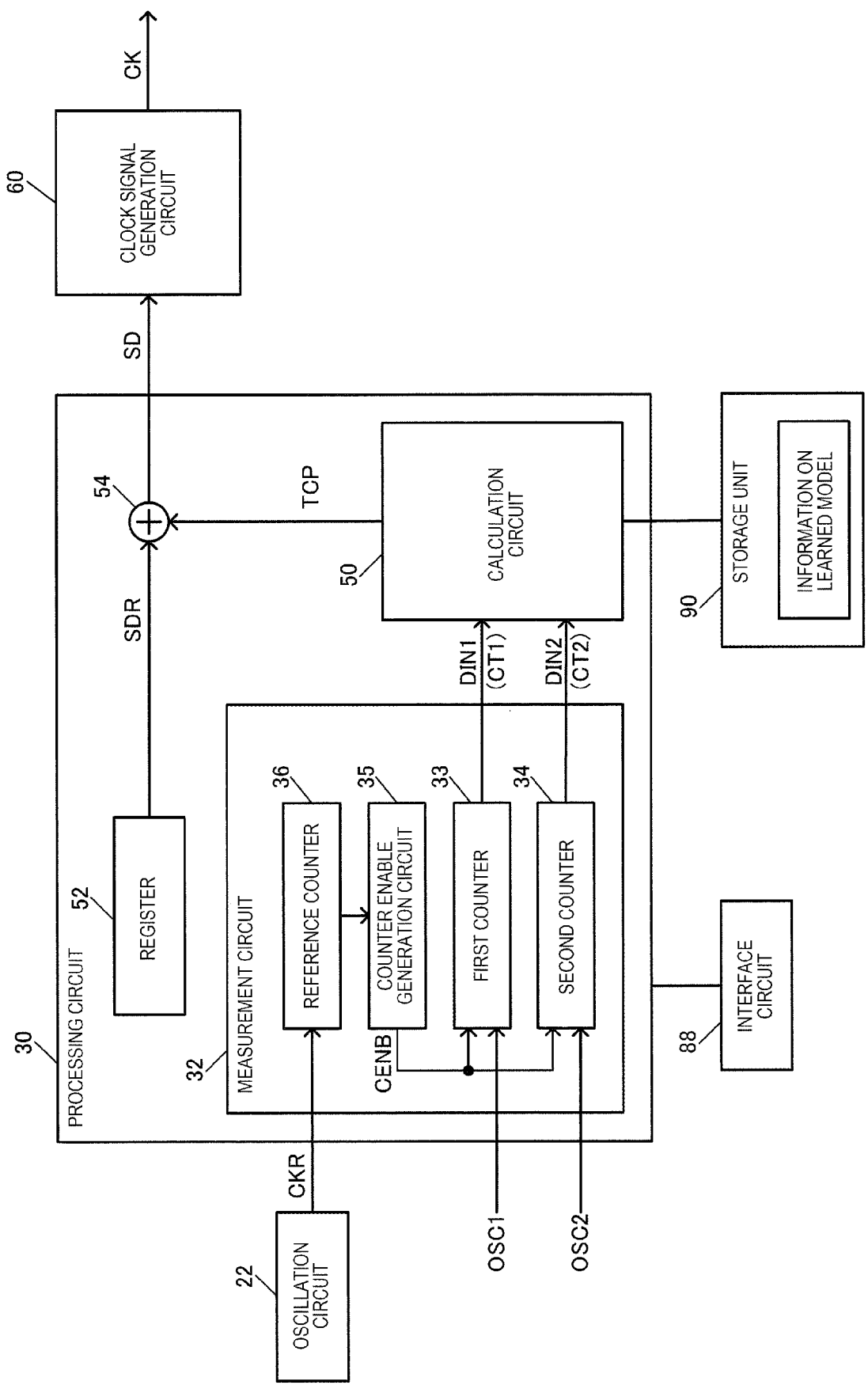
FIG. 10 shows a second configuration example of the processing circuit and the measurement circuit.

FIG. 10 shows a second configuration example of the processing circuit 30 and the measurement circuit 32. In FIG. 10, the measurement circuit 32 includes the first counter 33, the second counter 34, the counter enable generation circuit 35, and a reference counter 36. The reference counter 36 performs reference clock count processing based on the reference clock signal CKR from the oscillation circuit 22. For example, a CR oscillation circuit or the like can be used as the oscillation circuit 22. The counter enable generation circuit 35 generates a counter enable signal CENB based on the result of the reference clock count processing in the reference counter 36 and outputs the generated signal to the first counter 33 and the second counter 34. For example, the counter enable signal CENB that becomes active during a period set by the reference clock count processing is output to the first counter 33 and the second counter 34. For example, the reference counter 36 starts the reference clock count processing when the measurement start signal becomes active. When the reference clock count processing starts, the counter enable generation circuit 35 activates the counter enable signal CENB. When the count value of the reference clock count processing reaches the measurement end count value, the counter enable generation circuit 35 changes the counter enable signal CENB from active to inactive. The first counter 33 performs the first count processing based on the oscillation signal OSC1 during a period in which the counter enable signal CENB is active. The count value CT1 of the first count processing is output to the calculation circuit 50 as the input data DIN1. For example, the count value CT1 at the end of the first count processing is output as the input data DIN1. The second counter performs the second count processing based on the oscillation signal OSC2 during a period in which the counter enable signal CENB is active. The count value CT2 of the second count processing is output to the calculation circuit 50 as the input data DIN2. For example, the count value CT2 at the end of the second count processing is output as the input data DIN2. The calculation circuit 50 obtains the temperature compensation data TCP by performing processing based on the information on the learned model with respect to the input data DIN1 and DIN2.

As described above, in FIG. 10, the processing circuit 30 performs the reference clock count processing based on the reference clock signal CKR. For example, the reference counter 36 performs the reference clock count processing. Further, the processing circuit 30 performs the first count processing based on the oscillation signal OSC1 and a second count processing based on the oscillation signal OSC2 during the period set by the reference clock count processing. For example, during the period when the counter enable signal CENB becomes active, the first counter 33 performs the first count processing, and the second counter 34 performs the second count processing. The processing circuit 30 performs the processing based on the information on the learned model using the count value CT1 of the first count processing and the count value CT2 of the second count processing as the input data DIN1 and DIN2. The count value CT1 is a first count value, and the count value CT2 is a second count value. In this way, highly accurate temperature compensation processing can be realized using the learned model in which the temperature compensation data TCP corresponding to each temperature is learned with the count values CT1 and CT2 as the input data DIN1 and DIN2. That is, the count values CT1 and CT2 in the period set by the reference counter 36 correspond to the frequencies (cycles) of the oscillation signals OSC1 and OSC2, respectively. That is, the count values CT1 and CT2 at each temperature correspond to the frequencies of the oscillation signals OSC1 and OSC2 at each temperature in the frequency-temperature characteristics in FIG. 3. Therefore, highly accurate temperature compensation processing can be realized by using the count values CT1 and CT2 as the input data DIN1 and DIN2 of the learned model.

Figure 11:
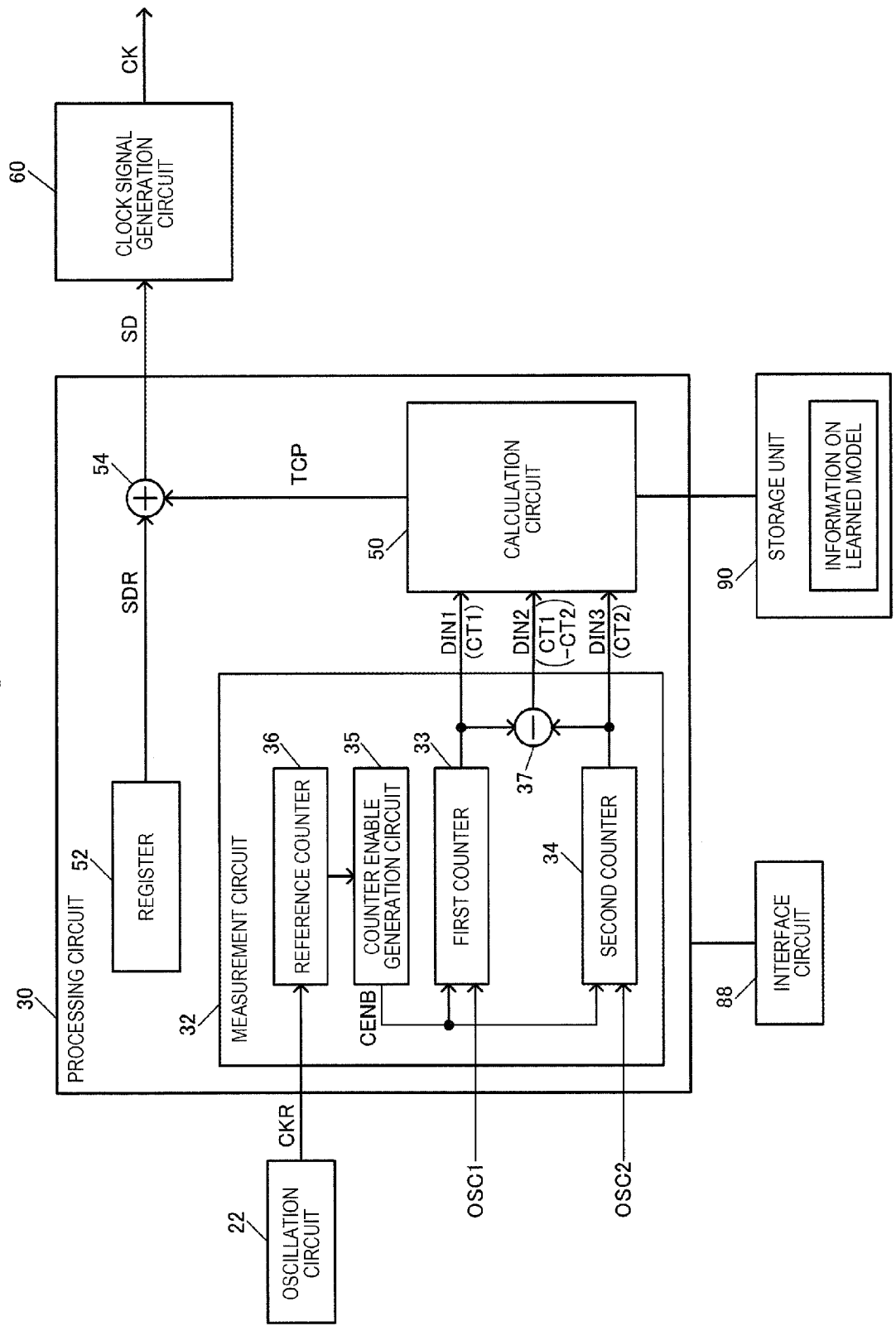
FIG. 11 shows a third configuration example of the processing circuit and the measurement circuit.

FIG. 11 shows a third configuration example of the processing circuit 30 and the measurement circuit 32. In FIG. 11, in addition to the configuration in FIG. 10, a subtractor is further provided. The subtractor 37 performs a subtraction processing for obtaining a count difference CT1−CT2 between the count value CT1 output from the first counter 33 and the count value CT2 output from the second counter 34. Thereby, the count difference CT1−CT2 is input to the calculation circuit 50 as the input data DIN3. Note that the subtractor 37 may be realized by an adder. Further, the count values CT1 and CT2 are also input to the calculation circuit 50 as the input data DIN1 and DIN2. The calculation circuit 50 obtains the temperature compensation data TCP by performing the processing based on the information on the learned model with respect to the input data DIN1, DIN2, and DIN3.

Figure 12:
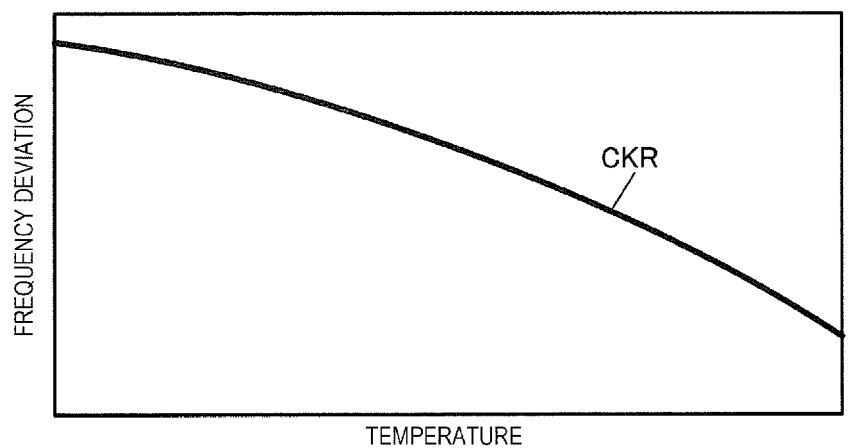
FIG. 12 shows an example of frequency-temperature characteristics of a reference clock signal.
Figure 13:
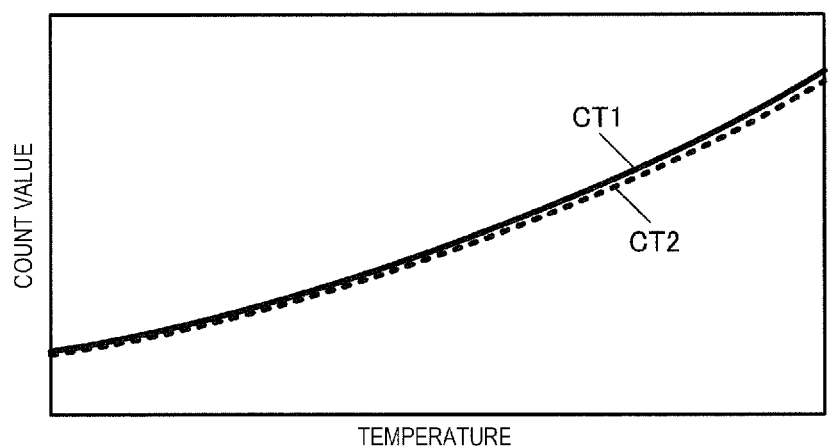
FIG. 13 shows an example of frequency-temperature characteristics of a count value.
Figure 14:
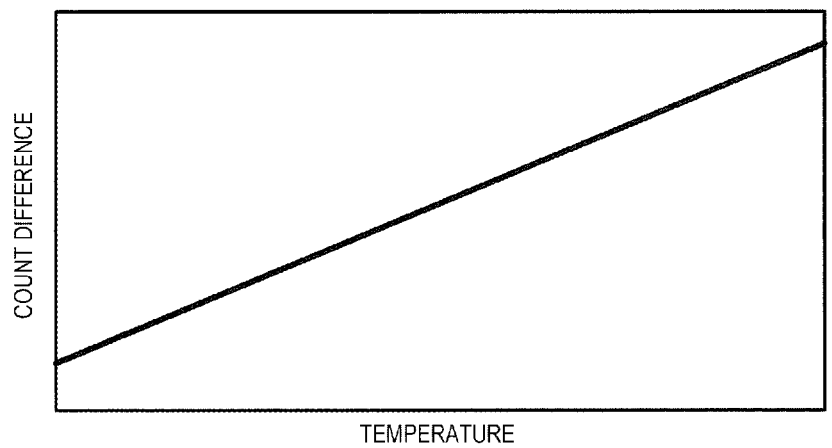
FIG. 14 shows an example of frequency-temperature characteristics of a count difference.

For example, FIG. 12 shows the frequency-temperature characteristics of the reference clock signal CKR. FIG. 13 shows the temperature characteristics of the count values CT1 and CT2 during the period set by the reference clock signal CKR. FIG. 14 shows the temperature characteristics of the count difference CT1−CT2 output from the subtractor 37 in FIG. 11. Similar to the input data DIN corresponding to the frequency difference in FIG. 4, the count difference CT1−CT2 is changed linearly with respect to temperature, and can be used as temperature measurement data. Accordingly, by inputting the input data DIN3 corresponding to the count difference CT1−CT2 to the calculation circuit 50, the highly accurate temperature compensation processing can be realized. In FIG. 11, the input data DIN1 and DIN2 corresponding to the count values CT1 and CT2 are also input to the calculation circuit 50. The learned model is learned so as to output the temperature compensation data TCP with respect to the input data DIN1, DIN2, and DIN3. Thus, by increasing the number of input data of the learned model, the temperature compensation processing can be further improved in accuracy. For example, for input data DIN1, DIN2, and DIN3, processing such as taking the powers of 2 or 3 of these input data values, is performed, and the processed data may be used as input data for the information on the learned model. Thereby, it is possible to expect further highly accurate temperature compensation processing.

4. Correction Residual Learning

In the present embodiment, the learning model may learn the correction residual of the polynomial approximation correction. FIG. 15 shows a configuration example of the calculation circuit 50 in this case. The calculation circuit 50 in FIG. 15 includes a polynomial approximation correction circuit 57, a neural network calculation circuit 58, and an adder 59. The polynomial approximation correction circuit 57 receives the input data DIN and obtains the temperature compensation data TCP1 by performing polynomial approximation correction processing based on the input data DIN. For example, the temperature compensation data TCP1 is obtained by performing the polynomial approximation correction processing based on the polynomial approximation coefficient information stored in the storage unit 90. The temperature compensation data TCP1 is the first temperature compensation data. The neural network calculation circuit 58 receives the input data DIN and outputs the correction residual of the polynomial approximation correction processing as temperature compensation data TCP2. The temperature compensation data TCP2 is second temperature compensation data. That is, the storage unit 90 stores the information on the learned model that is machine-learned so as to output the correction residual of the polynomial approximation correction processing as the temperature compensation data TCP2. Specifically, the storage unit 90 stores, for example, the weighting coefficient information of the neural network as the information on the learned model. The neural network calculation circuit 58 obtains the temperature compensation data TCP2 by performing the processing based on the weighting coefficient information that is the information on the learned model with respect to the input data DIN. The adder 59 outputs the temperature compensation data TCP by performing adding processing on the temperature compensation data TCP1 and the temperature compensation data TCP2.

As described above, in FIG. 15, the processing circuit 30 obtains the temperature compensation data TCP1 by performing the polynomial approximation correction processing based on the input data DIN. Further, the processing circuit 30 obtains the second temperature compensation data TCP2 corresponding to the correction residual of the polynomial approximation correction processing based on the information on the learned model. For example, the learned model is machine-learned so that the correction residual of the polynomial approximation correction processing is output as the temperature compensation data TCP2. The processing circuit 30 obtains the temperature compensation data TCP by performing adding processing on the temperature compensation data TCP1 and the temperature compensation data TCP2.

Figure 16:
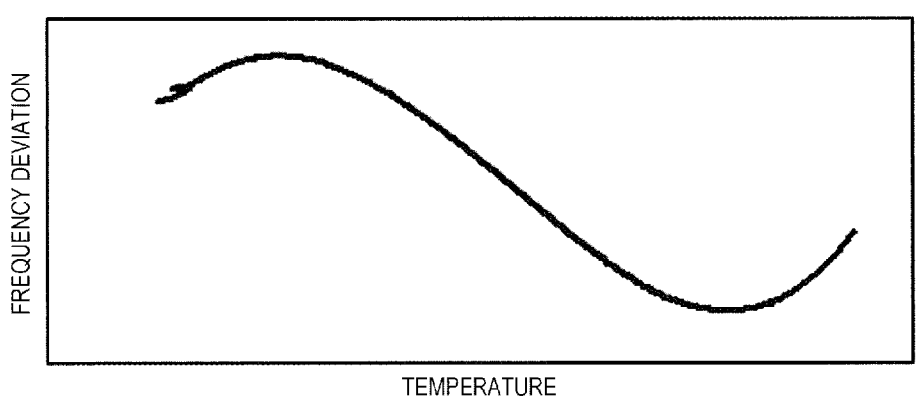
FIG. 16 shows an example of frequency-temperature characteristics of a resonator.
Figure 17:
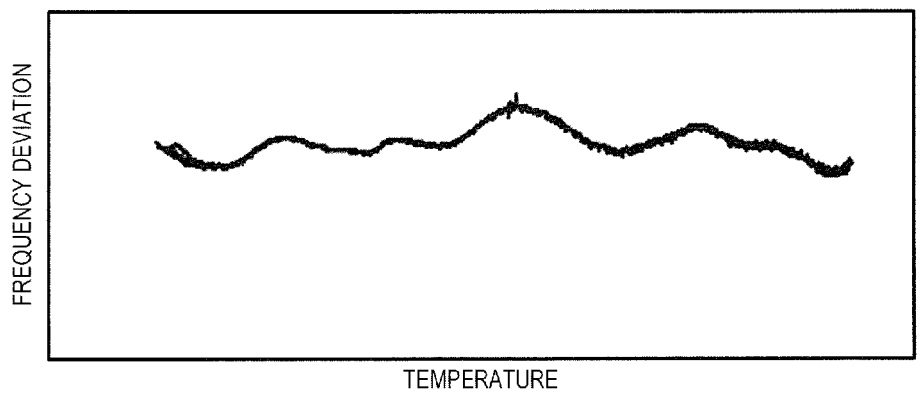
FIG. 17 shows an example of frequency-temperature characteristics of a correction residual.
Figure 18:
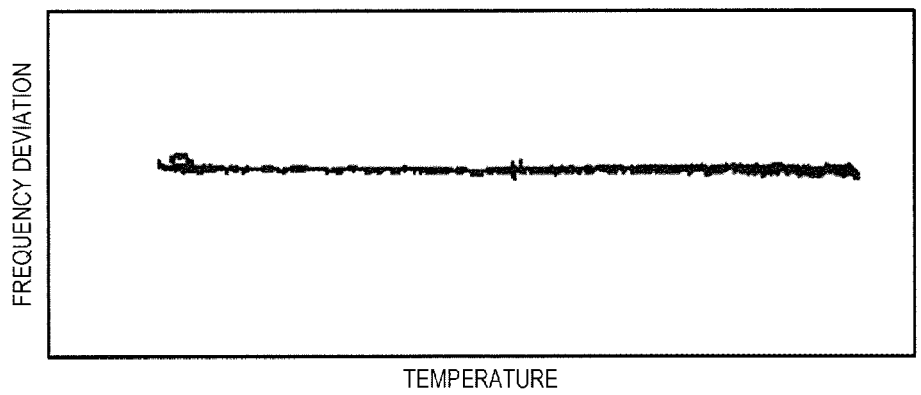
FIG. 18 shows an example of frequency-temperature characteristics of a clock signal when the correction residual is learned.

FIG. 16 shows an example of the frequency-temperature characteristics of the resonator. FIG. 17 is an example of the frequency-temperature characteristics of the correction residual when, for example, the polynomial approximation correction is performed with respect to the frequency-temperature characteristics in FIG. 16. For example, by performing the polynomial approximation correction, an absolute value of the frequency deviation of the correction residual can be reduced to substantially 100 ppb or less, for example. In the configuration in FIG. 15, learned model in which the correction residual is machine-learned shown in FIG. 17 is used. For example, the neural network calculation circuit 58 performs the neural network calculation processing using the information on the learned model that is machine-learned so as to output the correction residual in FIG. 17 as the temperature compensation data TCP2 with respect to the input data DIN. FIG. 18 is an example of the frequency-temperature characteristics of the clock signal CK when the correction residual of the polynomial approximation correction is machine-learned as described above. In FIG. 18, since the correction residual in FIG. 17 is also removed, the frequency deviation is sufficiently small, and the highly accurate temperature compensation processing is realized. In this way, in FIG. 15, since the polynomial approximation correction is performed and the temperature compensation processing is also performed using the learned model in which the correction residual of the polynomial approximation correction is machine-learned, the highly accurate temperature compensation processing can be realized as compared with the case where the temperature compensation data that directly temperature compensates the frequency-temperature characteristics in FIG. 16 is machine-learned. Note that the scale of the vertical axis in FIG. 16 is 100 times the scale of the vertical axis in FIGS. 17 and 18. Further, the scale of the vertical axis in FIG. 17 is equal to the scale of the vertical axis in FIG. 18.

The polynomial approximation correction circuit 57 in FIG. 15 performs the correction processing for compensating the frequency-temperature characteristics of the resonator by the polynomial approximation. The storage unit 90 stores polynomial coefficient information in the polynomial approximation. For example, the polynomial approximation correction circuit 57 performs the correction processing for approximating the 0th-order components based on the coefficient information for the 0th-order components read from the storage unit 90. Further, the polynomial approximation correction circuit 57 performs the correction processing for approximating the first-order components, the correction processing for approximating the third-order components, and the correction processing for approximating the higher-order components of the frequency-temperature characteristics of the resonator based on the coefficient information for the first-order components, the third-order components, and the higher-order components, which are read from the storage unit 90. The higher-order components are fourth-order or higher components. The polynomial approximation correction circuit 57 outputs temperature compensation data TCP1 for polynomial approximation correction by performing the correction processing. Note that the polynomial approximation performed by the polynomial approximation correction circuit 57 may be only the first-order components.

5. Learning Processing

Figure 19:
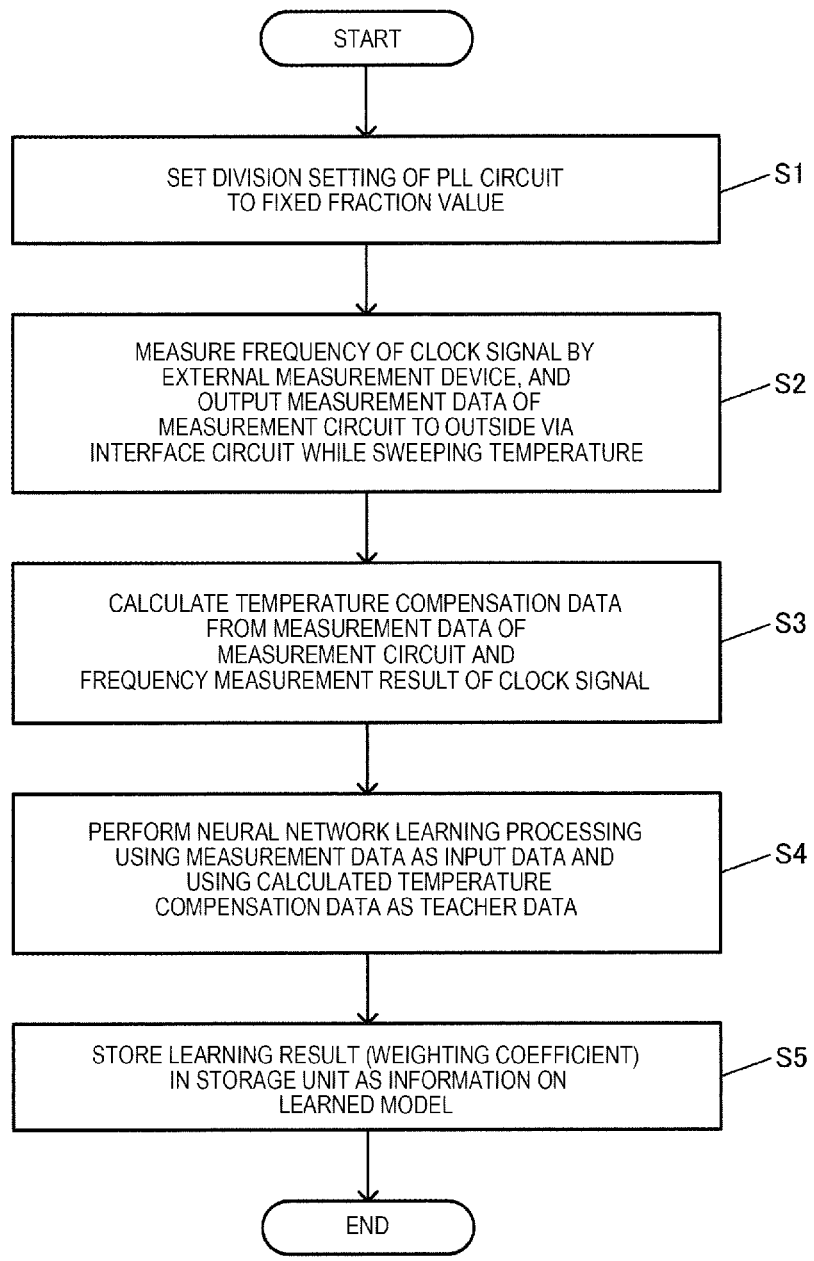
FIG. 19 is a flowchart for explaining an example of learning processing.

Next, the learning processing will be described. FIG. 19 is a flowchart for explaining an example of learning processing. The details of the learning processing will be described using the configuration in FIG. 5 as an example.

First, the division setting of the PLL circuit 61 is set to a fixed fraction value (step S1). For example, the temperature compensation data TCP is set to a fixed value, DIVA is set so as to be a target frequency, and the fractional PLL circuit 61 is operated so as to perform a division with a fixed fractional division. Further, the frequency of the clock signal CK is measured by an external measurement device, and the measurement data of the measurement circuit 32 is output to the outside via the interface circuit 88 while sweeping the temperature (step S2). In FIG. 5, the input data DIN that is measurement data of the measurement circuit 32 is output to the outside via the interface circuit 88.

Next, the temperature compensation data is calculated from the measurement data of the measurement circuit 32 and the frequency measurement result of the clock signal CK (step S3). Then, a neural network learning processing is performed using the measurement data as input data and using the calculated temperature compensation data as teacher data (step S4). The learning result is stored in the storage unit 90 as the information on the learned model (step S5). For example, the weighting coefficient information of the neural network is stored in the storage unit 90 as information on a learned model. Such learning processing shown in FIG. 19 is performed when the oscillator 4 is manufactured or shipped. During the actual operation of the oscillator 4, the processing circuit 30 executes the temperature compensation processing for obtaining the temperature compensation data TCP corresponding to the input data DIN, based on the information on the learned model stored in the storage unit 90.

When the correction residual of the polynomial approximation correction is learned as shown in FIG. 15, the polynomial approximation is calculated by using the least squares method with the temperature detection data that is measurement data of the measurement circuit 32 as input data, and with the division ratio of the PLL circuit 61 for performing the temperature correction as an expected value. Further, the result calculated by the polynomial approximation may be subtracted from the division ratio of the PLL circuit 61, the correction residual that is an approximation error may be calculated, and the neural network learning processing may be performed using the correction residual as teacher data.

6. Electronic Apparatus and Vehicle

Figure 20:
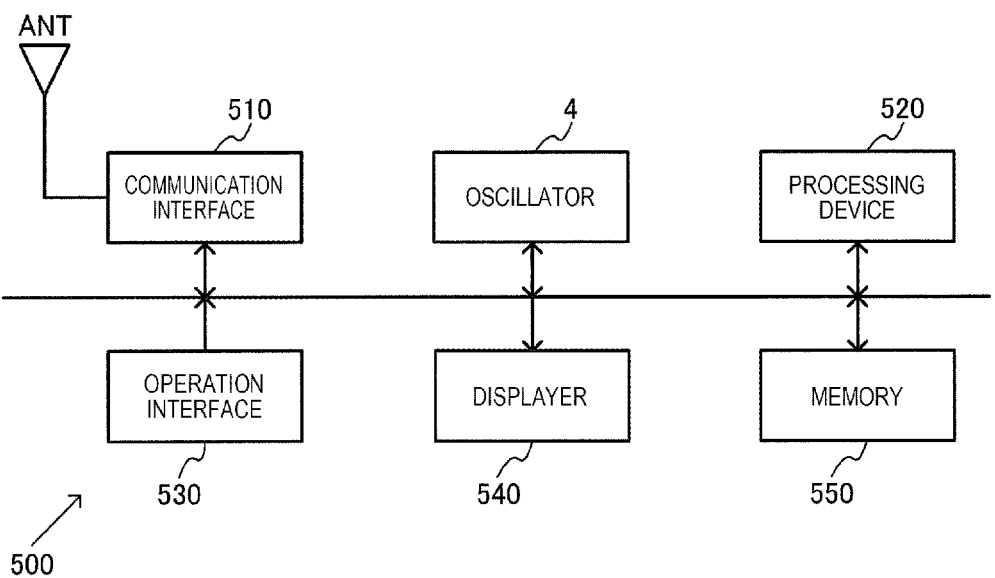
FIG. 20 shows a configuration example of an electronic apparatus.

FIG. 20 shows a configuration example of an electronic apparatus 500 including the oscillator 4 in the present embodiment. The electronic apparatus 500 includes an oscillator 4 and a processing device 520 that operates based on a clock signal CK from the oscillator 4. The electronic apparatus 500 can include an antenna ANT, a communication interface 510, an operation interface 530, a displayer 540, and a memory 550. The electronic apparatus 500 is not limited to the configuration shown in FIG. 20, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the oscillator 4 of the present embodiment can be used in various apparatuses such as a base station, a remote radio head (RRH), or a mobile communication terminal of a next generation mobile communication system. In the next generation mobile communication system, a highly accurate clock frequency is required for time synchronization and the like, which is suitable as an application example of the oscillator 4 of the present embodiment that can generate a highly accurate clock signal.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

Figure 21:
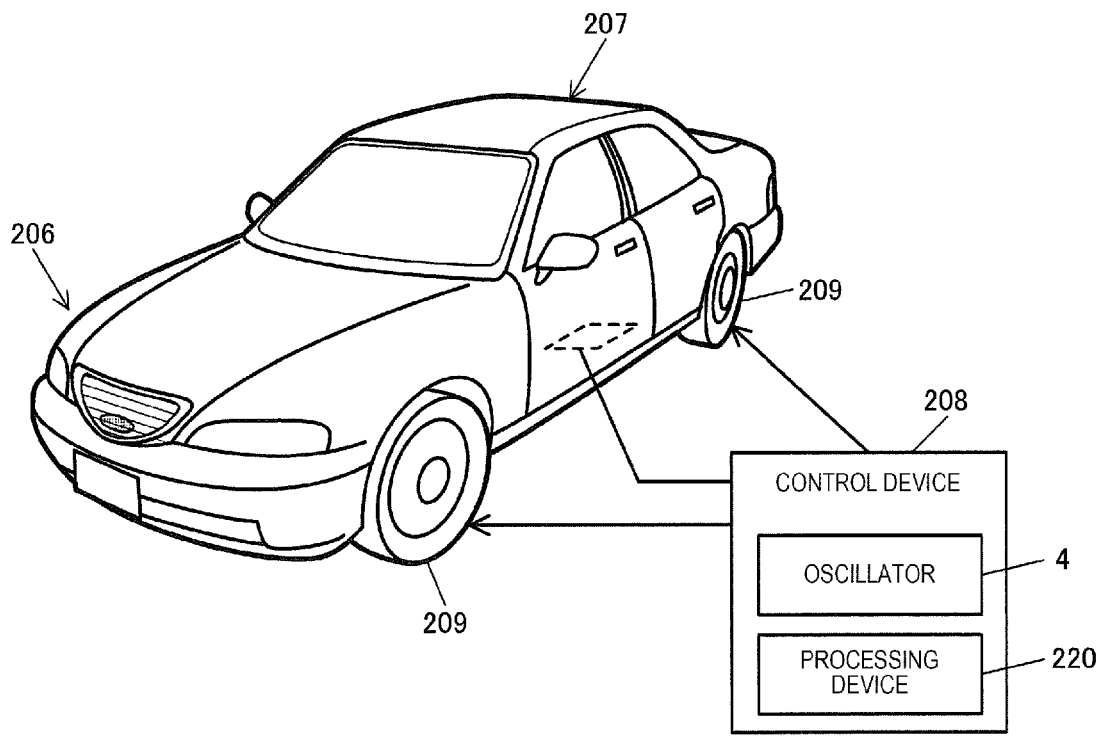
FIG. 21 shows a configuration example of a vehicle.

FIG. 21 shows an example of a vehicle including the oscillator 4 in the present embodiment. The vehicle includes an oscillator 4 and a processing device 220 that operates based on a clock signal CK from the oscillator 4. The oscillator 4 of the present embodiment can be incorporated into various vehicles such as vehicles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 21 schematically shows an automobile 206 as a specific example of the vehicle. In the automobile 206, the oscillator 4 in the present embodiment is incorporated. The control device 208 includes the oscillator 4 and the processing device 220 that operates based on the clock signal CK generated by the oscillator 4. The control device 208, for example, controls the hardness of the suspension according to the posture of a vehicle body 207, and controls brakes of the individual wheels 209. For example, automatic driving of the automobile 206 may be realized by the control device 208. The apparatus in which the oscillator 4 of the present embodiment is incorporated is not limited to such a control device 208, and can be incorporated in various in-vehicle apparatuses such as a meter panel apparatus and a navigation apparatus provided in a vehicle such as the automobile 206.

As described above, the oscillator according to the present embodiment includes a first resonator, a second resonator, a first oscillation circuit generating a first oscillation signal by oscillating the first resonator, a second oscillation circuit generating a second oscillation signal that has frequency-temperature characteristics different from frequency-temperature characteristics of the first oscillation signal by oscillating the second resonator. The oscillator also includes a clock signal generation circuit generating a clock signal with a frequency that is temperature compensated by temperature compensation data, a storage unit storing information on a learned model that is machine-learned to output data corresponding to the temperature compensation data with respect to input data, and a processing circuit obtaining the temperature compensation data by performing processing based on the information on the learned model with respect to the input data based on the first oscillation signal and the second oscillation signal.

According to the present embodiment, the first oscillation signal and the second oscillation signal having different frequency-temperature characteristics with each other are generated by oscillating the first resonator and the second resonator. Further, the storage unit stores the information on the learned model that is machine-learned so as to output data corresponding to the temperature compensation data with respect to input data. The temperature compensation data is obtained by performing processing based on the information on the learned model with respect to the input data based on the first oscillation signal and the second oscillator signal, and a clock signal with a frequency that is temperature compensated by the temperature compensation data is generated. In this way, the temperature compensation processing of the frequency of the clock signal can be realized using the input data based on the first oscillation signal and the second oscillation signal having different frequency-temperature characteristics with each other as temperature measurement data. By using the information on the learned model, more accurate and appropriate temperature compensation data can be obtained, and a highly accurate temperature compensation processing using the learned model can be realized.

In the present embodiment, the processing circuit may include a measurement circuit that receives the first oscillation signal and the second oscillation signal and a calculation circuit that receives measurement data of the measurement circuit as the input data and obtains the temperature compensation data based on the information on the learned model. Further, the processing circuit may output setting data corrected by the temperature compensation data to the clock signal generation circuit, and the clock signal generation circuit may generate the clock signal based on the setting data.

In this way, the temperature compensation data is obtained by performing processing based on the information on the learned model using the measurement data of the measurement circuit as input data, and the temperature compensated clock signal can be generated based on the setting data corrected by the obtained temperature compensation data.

In the present embodiment, the clock signal generation circuit may include a fractional N-type PLL circuit, and the processing circuit may output division ratio setting data corrected by the temperature compensation data to a dividing circuit included in the PLL circuit.

In this way, the temperature compensated clock signal can be generated by setting the division ratio of the PLL circuit based on the division ratio setting data corrected by the temperature compensation data obtained based on the information on the learned model.

Further, in the present embodiment, the PLL circuit may include a phase comparison circuit that performs a phase comparison between an input clock signal based on the first oscillation signal and a feedback clock signal from the dividing circuit, a control voltage generation circuit that generates a control voltage based on a result of the phase comparison, and a voltage controlled oscillation circuit that generates an output clock signal with a frequency corresponding to the control voltage.

By using the PLL circuit having such a configuration, a PLL circuit output clock signal which is phase synchronized with the first oscillation signal can be generated, and a highly accurate clock signal based on the output clock signal can be generated.

In the present embodiment, the clock signal generation circuit may include a direct digital synthesizer, and the processing circuit may output frequency setting data corrected by the temperature compensation data to the direct digital synthesizer.

By using such a direct digital synthesizer, the clock signal having any frequency set by the frequency setting data can be generated. By using the frequency setting data corrected by the temperature compensation data, it becomes possible to generate a temperature compensated highly accurate clock signal.

In the present embodiment, the clock signal generation circuit may include a D/A conversion circuit that D/A converts frequency setting data and outputs a control voltage of a frequency and a voltage controlled oscillation circuit that oscillates a third resonator at a frequency corresponding to the control voltage from the D/A conversion circuit, and the processing circuit outputs the frequency setting data corrected by the temperature compensation data to the D/A conversion circuit.

In this way, the frequency setting data corrected by the temperature compensation data is D/A converted, and it becomes possible to generate a temperature compensated clock signal by oscillating the third resonator at a frequency corresponding to the control voltage obtained by the D/A conversion.

In the present embodiment, the processing circuit may obtain frequency difference data representing a difference between a frequency of the first oscillation signal and a frequency of the second oscillation signal based on the first oscillation signal and the second oscillation signal, and perform processing based on the information on the learned model using the frequency difference data as the input data.

By obtaining the frequency difference data between the first oscillation signal and the second oscillation signal in this way, input data that can be used as the temperature measurement data can be obtained, and by performing the processing based on the information on the learned model with respect to this input data, the highly accurate temperature compensation data can be obtained.

In the present embodiment, the processing circuit may perform first count processing based on the first oscillation signal, perform second count processing based on the second oscillation signal in a period set by the first count processing, and perform processing based on the information on the learned model using a count value of the second count processing as the input data.

In this way, by performing the second count processing in the period set by the first count processing and using the count value of the second count processing as input data, the processing based on the information on the learned model can be performed with the data corresponding to the frequency difference between the first oscillation signal and the second oscillation signal as the input data.

In this embodiment, the processing circuit may perform reference clock count processing based on a reference clock signal, perform first count processing based on the first oscillation signal and second count processing based on the second oscillation signal in a period set by the reference clock count processing, and perform processing based on the information on the learned model using a first count value of the first count processing and a second count value of the second count processing as the input data.

In this way, the highly accurate temperature compensation processing can be realized using the learned model that is learned the temperature compensation data corresponding to each temperature with the first count value of the first count processing and the second count value of the second count processing as the input data.

In the present embodiment, the processing circuit may obtain first temperature compensation data by performing polynomial approximation correction processing based on the input data, and the learned model may be machine-learned so as to output the correction residual of the polynomial approximation correction processing as the second temperature compensation data. Further, the processing circuit may obtain the temperature compensation data by performing adding processing of the first temperature compensation data and the second temperature compensation data.

In this embodiment, the processing circuit may obtain first temperature compensation data by performing polynomial approximation correction processing based on the input data, obtain second temperature compensation data corresponding to a correction residual of the polynomial approximation correction processing based on the information on the learned model, and obtain the temperature compensation data by performing adding processing of the first temperature compensation data and the second temperature compensation data.

In this way, since the temperature compensation processing is performed by the polynomial approximation correction, and also the temperature compensation processing is performed using the learned model, in which the correction residual of the polynomial approximation correction is machine-learned, the highly accurate temperature compensation processing can be realized.

In this embodiment, an interface circuit outputting the input data to an outside may be included.

In this way, the input data to be processed based on the information on the learned model can be output to the outside via the interface circuit, and the learning processing using the input data can be realized.

In the present embodiment, the learned model may be machine-learned based on the input data output from the interface circuit and a frequency measurement result of the clock signal.

In this way, the temperature compensation data can be obtained by using the learned model that is machine-learned from the input data output from the interface circuit and the measurement result of the frequency of the clock signal, and the temperature compensation processing of the clock signal can be realized.

Further, in the present embodiment, the processing circuit may perform neural network calculation processing as the processing based on the information on the learned model.

In this way, the highly accurate temperature compensation data can be obtained by performing the neural network calculation with respect to the input data, and the clock signal with a frequency that is temperature compensated by this temperature compensation data can be generated.

The present embodiment relates to an electronic apparatus including the oscillator described above and a processing device that operates based on the clock signal from the oscillator.

Further, the present embodiment relates to a vehicle including the oscillator described above and a processing device that operates based on the clock signal from the oscillator.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configurations and operations and the like of the oscillator, the resonator, the first oscillation circuit, the second oscillation circuit, the processing circuit, the clock signal generation circuit, the measurement circuit, the electronic apparatus, and the vehicle are described in the present embodiment, but the present disclosure is not limited to this, and various modifications can be made.

What is claimed is:

1. An oscillator comprising:
a first resonator;
a second resonator;
a first oscillation circuit generating a first oscillation signal by oscillating the first resonator;
a second oscillation circuit generating a second oscillation signal that has frequency-temperature characteristics different from frequency-temperature characteristics of the first oscillation signal by oscillating the second resonator;
a clock signal generation circuit generating a clock signal with a frequency that is temperature compensated by temperature compensation data;
a storage unit storing information on a learned model that is machine-learned to output data corresponding to the temperature compensation data with respect to input data; and
a processing circuit obtaining the temperature compensation data by performing processing based on the information on the learned model with respect to the input data based on the first oscillation signal and the second oscillation signal,
wherein the processing circuit obtains frequency difference data representing a difference between a frequency of the first oscillation signal and a frequency of the second oscillation signal based on the first oscillation signal and the second oscillation signal, and performs processing based on the information on the learned model using the frequency difference data as the input data.

2. The oscillator according to claim 1, wherein the processing circuit includes
a measurement circuit that receives the first oscillation signal and the second oscillation signal, and
a calculation circuit that receives measurement data of the measurement circuit as the input data and obtains the temperature compensation data based on the information on the learned model,
the processing circuit outputs setting data corrected by the temperature compensation data to the clock signal generation circuit, and
the clock signal generation circuit generates the clock signal based on the setting data.

3. The oscillator according to claim 1, wherein the clock signal generation circuit includes a fractional N-type PLL circuit, and
the processing circuit outputs division ratio setting data corrected by the temperature compensation data to a dividing circuit included in the PLL circuit.

4. The oscillator according to claim 3, wherein the PLL circuit includes
a phase comparison circuit that performs a phase comparison between an input clock signal based on the first oscillation signal and a feedback clock signal from the dividing circuit,
a control voltage generation circuit that generates a control voltage based on a result of the phase comparison, and
a voltage controlled oscillation circuit that generates an output clock signal with a frequency corresponding to the control voltage.

5. The oscillator according to claim 1, wherein the clock signal generation circuit includes a direct digital synthesizer, and the processing circuit outputs frequency setting data corrected by the temperature compensation data to the direct digital synthesizer.

6. The oscillator according to claim 1, wherein the clock signal generation circuit includes
a D/A conversion circuit that D/A converts frequency setting data and outputs a control voltage of a frequency and
a voltage controlled oscillation circuit that oscillates a third resonator at a frequency corresponding to the control voltage from the D/A conversion circuit, and
the processing circuit outputs the frequency setting data corrected by the temperature compensation data to the D/A conversion circuit.

7. The oscillator according to claim 1, wherein the processing circuit
obtains first temperature compensation data by performing polynomial approximation correction processing based on the input data,
obtains second temperature compensation data corresponding to a correction residual of the polynomial approximation correction processing based on the information on the learned model, and
obtains the temperature compensation data by performing adding processing of the first temperature compensation data and the second temperature compensation data.

8. The oscillator according to claim 1, further comprising:
an interface circuit outputting the input data to an outside.

9. The oscillator according to claim 8, wherein the learned model is machine-learned based on the input data output from the interface circuit and a frequency measurement result of the clock signal.

10. The oscillator according to claim 1, wherein the processing circuit performs neural network calculation processing as the processing based on the information on the learned model.

11. An electronic apparatus comprising:
the oscillator according to claim 1; and
a processing device that operates based on the clock signal from the oscillator.

12. A vehicle comprising:
the oscillator according to claim 1; and
a processing device that operates based on the clock signal from the oscillator.

13. An oscillator comprising:
a first resonator;
a second resonator;
a first oscillation circuit generating a first oscillation signal by oscillating the first resonator;
a second oscillation circuit generating a second oscillation signal that has frequency-temperature characteristics different from frequency-temperature characteristics of the first oscillation signal by oscillating the second resonator;
a clock signal generation circuit generating a clock signal with a frequency that is temperature compensated by temperature compensation data;
a storage unit storing information on a learned model that is machine-learned to output data corresponding to the temperature compensation data with respect to input data; and
a processing circuit obtaining the temperature compensation data by performing processing based on the information on the learned model with respect to the input data based on the first oscillation signal and the second oscillation signal, wherein the processing circuit performs first count processing based on the first oscillation signal, performs second count processing based on the second oscillation signal in a period set by the first count processing, and performs processing based on the information on the learned model using a count value of the second count processing as the input data.

14. An oscillator comprising:
a first resonator;
a second resonator;
a first oscillation circuit generating a first oscillation signal by oscillating the first resonator;
a second oscillation circuit generating a second oscillation signal that has frequency-temperature characteristics different from frequency-temperature characteristics of the first oscillation signal by oscillating the second resonator;
a clock signal generation circuit generating a clock signal with a frequency that is temperature compensated by temperature compensation data;
a storage unit storing information on a learned model that is machine-learned to output data corresponding to the temperature compensation data with respect to input data; and
a processing circuit obtaining the temperature compensation data by performing processing based on the information on the learned model with respect to the input data based on the first oscillation signal and the second oscillation signal,
wherein the processing circuit performs reference clock count processing based on a reference clock signal, performs first count processing based on the first oscillation signal and second count processing based on the second oscillation signal in a period set by the reference clock count processing, and performs processing based on the information on the learned model using a first count value of the first count processing and a second count value of the second count processing as the input data.

* * * * *